United States Patent
Choi et al.

(10) Patent No.: US 11,405,029 B2
(45) Date of Patent: Aug. 2, 2022

(54) DUTY ADJUSTMENT CIRCUIT, AND DELAY LOCKED LOOP CIRCUIT AND SEMICONDUCTOR MEMORY DEVICE INCLUDING THE SAME

(71) Applicant: SAMSUNG ELECTRONICS CO., LTD., Suwon-si (KR)

(72) Inventors: Hundae Choi, Hwaseong-si (KR); Garam Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/201,620

(22) Filed: Mar. 15, 2021

(65) Prior Publication Data

US 2022/0052678 A1 Feb. 17, 2022

(30) Foreign Application Priority Data

Aug. 14, 2020 (KR) ........................ 10-2020-0102138

(51) Int. Cl.
*H03K 5/156* (2006.01)
*H03L 7/081* (2006.01)
(Continued)

(52) U.S. Cl.
CPC .......... *H03K 5/1565* (2013.01); *G11C 7/222* (2013.01); *G11C 8/10* (2013.01); *G11C 8/18* (2013.01);
(Continued)

(58) Field of Classification Search
CPC .......... H03K 5/1565; H03K 7/08; H03K 7/06; H03K 7/04; H03K 5/00; H03K 5/04; H03K 3/78; H03K 9/06; G11C 7/222; G11C 8/10; G11C 8/18; G11C 7/1057; G11C 7/1084; G11C 7/1072; G11C 11/4076;
(Continued)

(56) References Cited

U.S. PATENT DOCUMENTS 6,040,726 A * 3/2000 Martin ................. H03K 5/1565
327/261
6,807,115 B2 * 10/2004 Kanetani .......... G01R 31/31701
365/201
(Continued)

FOREIGN PATENT DOCUMENTS

CN 104242921 A * 12/2014 ............... H03K 7/08
CN 104578756 B * 10/2017 ............... H03K 4/48
(Continued)

*Primary Examiner* — Fernando Hidalgo
(74) *Attorney, Agent, or Firm* — Sughrue Mion, PLLC

(57) ABSTRACT

A duty adjustment circuit, and a delay locked loop circuit and a semiconductor memory device including the same are provided. The duty adjustment circuit includes a pulse generator configured to generate a pulse signal at a constant pulse width regardless of a frequency of a reference clock signal, based on frequency information, a code generator configured to generate a first predetermined number of delayed pulse signals by delaying the pulse signal, as a first code in response to the pulse signal, and a duty adjuster configured to receive a delay clock signal, and generate a duty correction clock signal by adjusting a slope of rising transition and a slope of falling transition of the delay clock signal in response to the first code and a second code.

20 Claims, 15 Drawing Sheets

(51) Int. Cl.
  *G11C 8/18*  (2006.01)
  *G11C 7/22*  (2006.01)
  *G11C 8/10*  (2006.01)
  *G11C 7/10*  (2006.01)

(52) U.S. Cl.
  CPC .......... *H03L 7/0812* (2013.01); *G11C 7/1057* (2013.01); *G11C 7/1084* (2013.01)

(58) Field of Classification Search
  CPC . H03L 7/0812; H04L 7/0331; H04L 25/4902; H04L 25/03834
  USPC ..................................................... 365/230.06
  See application file for complete search history.

(56) References Cited

U.S. PATENT DOCUMENTS

| | | | |
|---|---|---|---|
| 7,961,021 B2 * | 6/2011 | Kim .......................... | G06F 1/04 327/284 |
| 7,977,996 B1 * | 7/2011 | Kjosness .............. | H03K 5/1565 708/313 |
| 8,674,733 B2 | 3/2014 | Kim | |
| 8,803,577 B2 | 8/2014 | Park et al. | |
| 9,018,980 B1 * | 4/2015 | Durairajan ................. | G06F 1/08 326/38 |
| 9,148,136 B2 | 9/2015 | Seo | |
| 9,160,350 B2 | 10/2015 | Zerbe et al. | |
| 9,501,041 B2 | 11/2016 | Shim et al. | |
| 9,654,093 B2 | 5/2017 | Yun et al. | |
| 10,582,597 B2 | 3/2020 | Xiu | |
| 10,615,810 B2 | 4/2020 | Zerbe et al. | |
| 2006/0028363 A1 * | 2/2006 | Rivoir ...................... | H03K 7/08 341/143 |
| 2008/0159057 A1 * | 7/2008 | Kim ................... | G11C 11/4097 365/233.12 |
| 2010/0289542 A1 * | 11/2010 | Yun .......................... | H03K 5/04 327/158 |
| 2011/0193604 A1 * | 8/2011 | Kim ..................... | H03K 5/1565 327/172 |
| 2013/0162312 A1 | 6/2013 | Jung et al. | |
| 2013/0187693 A1 | 7/2013 | Chung et al. | |
| 2013/0249618 A1 | 9/2013 | Kwak et al. | |
| 2014/0021990 A1 | 1/2014 | Na | |
| 2014/0225651 A1 | 8/2014 | Haerle et al. | |
| 2016/0373119 A1 | 12/2016 | Wei et al. | |
| 2017/0366178 A1 * | 12/2017 | Minzoni ............... | H03L 7/0812 |
| 2018/0239001 A1 * | 8/2018 | Dussan ................... | G01S 17/66 |
| 2020/0059226 A1 | 2/2020 | Choi et al. | |

FOREIGN PATENT DOCUMENTS

| KR | 20010109145 A | * | 12/2001 |
|---|---|---|---|
| KR | 20080061979 A | * | 7/2008 |

* cited by examiner

DUTY ADJUSTMENT CIRCUIT, AND DELAY LOCKED LOOP CIRCUIT AND SEMICONDUCTOR MEMORY DEVICE INCLUDING THE SAME

CROSS-REFERENCE TO THE RELATED APPLICATION

This application is based on and claims priority under Korean Patent Application No. 10-2020-0102138, filed on Aug. 14, 2020, in the Korean Intellectual Property Office, the disclosure of which is incorporated by reference herein in its entirety.

BACKGROUND

1. Field

The disclosure relates to a duty adjustment circuit and a delay locked loop circuit, and a semiconductor memory device including the same.

2. Description of the Related Art

A delay locked loop circuit is designed to generate an output clock signal synchronized with a phase of an input clock signal.

In general, a delay locked loop circuit includes a variable delay unit including delay cells for generating a delay clock signal by variably delaying a reference clock signal generated by buffering an input clock signal, according to a code. The delay locked loop circuit also includes a phase detector for detecting a phase difference between the reference clock signal and a feedback clock signal formed by replicating a path until an output clock signal is generated from the delay clock signal and generating the code value. In addition, the delay locked loop circuit further includes a duty adjustment circuit to correct a duty cycle (or a duty ratio) of the output clock signal.

SUMMARY

Exemplary embodiments of the disclosure provide a duty adjustment circuit for accurately correcting a duty cycle (or a duty ratio) of an output clock signal even if the frequency of an input clock signal, besides a process, a voltage, and a temperature, are changed, and a delay locked loop circuit and a semiconductor memory device including the same.

The technical problems solved by the exemplary embodiments are not limited to the above technical problems, and other technical problems which are not described herein may be solved and will become apparent to those skilled in the art from the following description.

In accordance with an exemplary embodiment, there is provided a duty adjustment circuit including: a pulse generator configured to generate a pulse signal at a constant pulse width regardless of a frequency of a reference clock signal, based on frequency information; a code generator configured to generate a first predetermined number of delayed pulse signals by delaying the pulse signal, as a first code in response to the pulse signal; and a duty adjuster configured to receive a delay clock signal, and generate a duty correction clock signal by adjusting a slope of rising transition and a slope of falling transition of the delay clock signal based on the first code and a second code.

In accordance with an exemplary embodiment, there is provided a delay locked loop circuit including: a divider configured to divide an input clock signal and generate a divided input clock signal as a reference clock signal; a delay unit configured to generate a delay clock signal by variably delaying the reference clock signal according to a phase difference detection code; a delay controller configured to detect a phase difference between the reference clock signal and a feedback clock signal and generate the phase difference detection code corresponding to the phase difference; a duty adjustment circuit configured to generate a pulse signal having a constant pulse width regardless of a frequency of the reference clock signal, based on frequency information, generate a first predetermined number of delayed pulse signals by delaying the pulse signal, as a first code in response to the pulse signal, and generate a duty correction clock signal by adjusting a slope of rising transition and a slope of falling transition of the delay clock signal according to the first code and a second code; a clock signal delay path unit configured to generate an output clock signal by delaying the duty correction clock signal by a predetermined time; and a clock signal delay replica unit configured to generate the feedback clock signal by delaying the duty correction clock signal by the predetermined time.

In accordance with an exemplary embodiment, there is provided a semiconductor memory device including: a clock signal input buffer configured to generate an input clock signal by buffering an external clock signal applied from an outside; a command and address generator configured to generate a mode set command, an active command, a read command, and a write command by decoding a command and address, generate an address signal included in the command and address as a mode set code in response to the mode set command, generate the address signal as a row address in response to the active command, and generate the address signal as a column address in response to the read command or the write command; a mode set register configured to receive the mode set code in response to the mode set command and set read latency, a burst length, frequency information, and a second code; and a delay locked loop configured to generate a reference clock signal by dividing the input clock signal, generate a feedback clock signal by delaying a duty correction clock signal by a predetermined time, detect a phase difference between the reference clock signal and the feedback clock signal to generate a phase difference detection code corresponding to the phase difference, and generate a delay clock signal by variably delaying the reference clock signal according to the phase difference detection code; a duty adjustment circuit configured to generate a pulse signal having a constant pulse width regardless of a frequency of the reference clock signal, based on the frequency information, generate a first predetermined number of delayed pulse signals by delaying the pulse signal, as a first code in response to the pulse signal, and generate the duty correction clock signal by adjusting a slope of rising transition and a slope of falling transition of the delay clock signal according to the first code and a second code; a latency controller configured to generate a latency signal that is activated while data is output to the outside based on the read latency and the burst length using the duty correction clock signal in response to the read command; a row decoder configured to generate a plurality of word line selection signals by decoding the row address; a column decoder configured to generate a plurality of column selection signals by decoding the column address; a memory cell array including a plurality of memory cells and configured to output read data from one or more memory cells selected from among the plurality of memory cells according to the plurality of word line selection signals and the plurality of column selection signals in response to the read command; a data read path unit configured to receive the read data and to generate output data using an internal clock signal; a data output buffer configured to receive the output data and generate the data by buffering the output data; an internal clock signal generator configured to generate a data strobe clock signal and the internal clock signal using the duty correction clock signal in response to the latency signal; and a data strobe signal output buffer configured to buffer the data strobe clock signal and output a data strobe signal to the outside, wherein the predetermined time includes a sum of a first delay time of the clock signal input buffer, a second delay time of the internal clock signal generator, and a third delay time of the data strobe signal output buffer or the data output buffer.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Hereinafter, a duty adjustment circuit, and a delay locked loop and a semiconductor memory device including the same according to various exemplary embodiments of the inventive concept will be described more fully with reference to the accompanying drawings.

Figure 1:
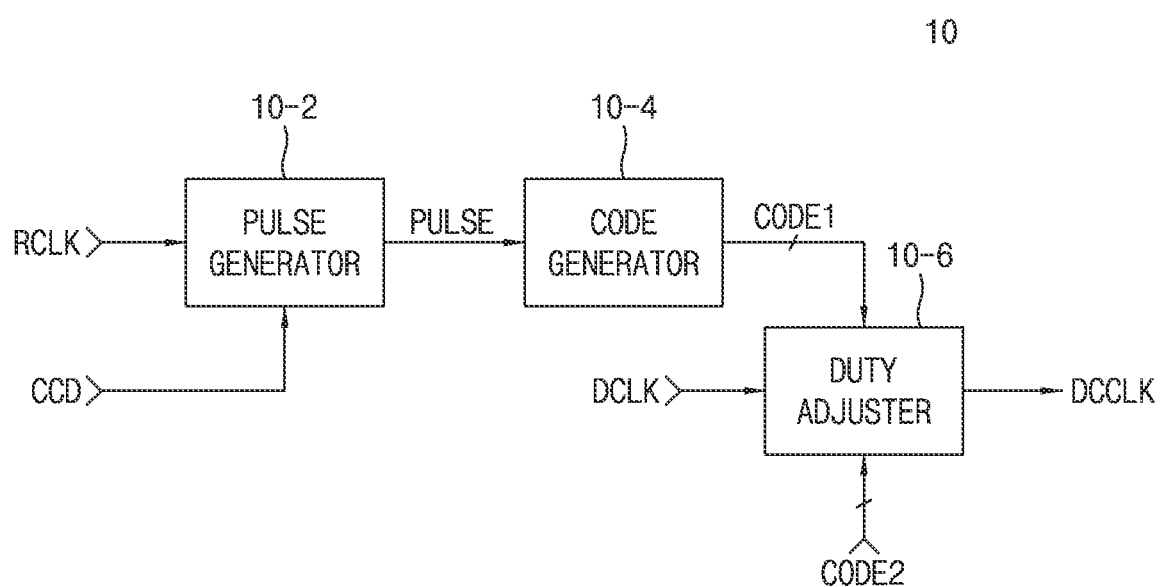
FIG. 1 is a block diagram of a duty adjustment circuit according to an exemplary embodiment.

FIG. 1 is a block diagram of a duty adjustment circuit according to an exemplary embodiment. A duty adjustment circuit 10 may include a pulse generator 10-2, a code generator 10-4, and a duty adjuster 10-6.

The respective functions of the blocks shown in FIG. 1 will be described below.

The pulse generator 10-2 may generate a pulse signal PULSE having a constant pulse width regardless of a frequency of a reference clock signal RCLK, based on frequency information CCD. For example, the frequency information CCD may be information indicating that the reference clock signal RCLK has a low frequency or a high frequency, and the pulse generator 10-2 may receive the reference clock signal RCLK of a high frequency or a low frequency and generate the pulse signal PULSE having a constant pulse width.

The code generator 10-4 may generate a predetermined number of delayed pulse signals by delaying the pulse signal PULSE by a predetermined delay time and may generate a first code CODE1 of a predetermined number of bits of data by latching the predetermined number of delayed pulse signals in response to the pulse signal PULSE. The predetermined delay time may change according to changes in a process, a voltage, and a temperature.

The duty adjuster 10-6 may generate a duty correction clock signal DCCLK by adjusting a slope of rising transition and falling transition of a delay clock signal DCLK according to the first code CODE1 and a second code CODE2. The second code CODE2 may be a fixed code.

Figure 2:
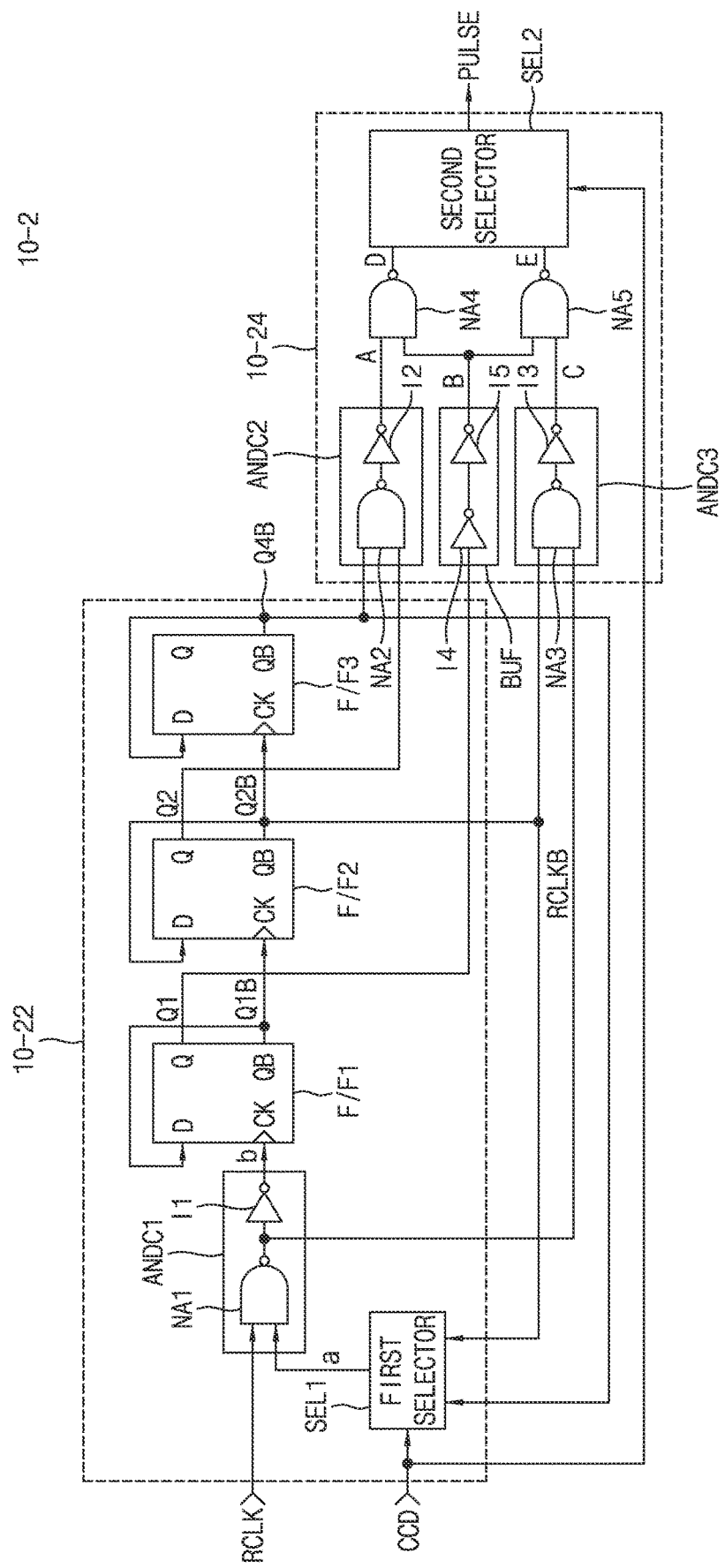
FIG. 2 is a diagram of a pulse generator according to an exemplary embodiment.

FIG. 2 is a diagram of a pulse generator according to an exemplary embodiment. The pulse generator 10-2 may include a first logic circuit unit 10-22 and a second logic circuit 10-24. The first logic circuit unit 10-22 may include a first selector SEL1, a first AND circuit ANDC1, and a first flip-flop F/F1 to a third flip-flop F/F3. The second logic circuit 10-24 may include a second AND circuit ANDC2, a third AND circuit ANDC3, a buffer BUF, a fourth NAND gate NA4, a fifth NAND gate NM, and a second selector SEL2. The first AND circuit ANDC1 may include a first NAND gate NA1 and a first inverter I1, the second AND circuit ANDC2 may include a second NAND gate NA2 and a second inverter I2, and the third AND circuit ANDC3 may include a third NAND gate NA3 and a third inverter I3. The buffer BUF may include a fourth inverter I4 and a fifth inverter I5. Each of the first flip-flop F/F1 to the third flip-flop F/F3 may include an input terminal D, a clock signal terminal CK, an output terminal Q, and an inverted output terminal QB, and the inverted output terminal QB and the input terminal D may be connected to each other. In other words, an output of the inverted output terminal QB may be fed back to the input terminal D in a feedback loop. That is, each of the first flip-flop F/F1 to the third flip-flop F/F3 may be a divider. When each of the first flip-flop F/F1 to the third flip-flop F/F3 is used as a divider, a frequency f of an input signal to the input terminal D may be divided by one-half and the output terminal Q may output an output signal at a frequency f/2. For example, a frequency f of an input signal to the input terminal D of the first flip-flop F/F1 may be divided by 2, and the first flip-flop F/F2 may output an output signal through the output terminal Q at a frequency f/2.

Referring to FIG. 2, the first logic circuit unit 10-22 may generate an inverted reference clock signal RCLKB by receiving and inverting the reference clock signal RCLK, and may generate a 2-divided reference clock signal Q1, a 4-divided reference clock signal Q2, and an 8-divided reference clock signal Q4 by dividing the reference clock signal RCLK in a cascading manner. That is, the first flip-flop F/F1 may divide a frequency fn of an input signal by one-half and output the 2-divided reference clock signal Q1 at a frequency fn/2, and the second flip-flop F/F2 may divide the frequency fn/2 of the 2-divided reference clock signal Q1 again by one-half to output the 4-divided reference clock signal Q2 at a frequency fin/4, and so on. In addition, the first logic circuit unit 10-22 may generate an inverted 2-divided reference clock signal Q1B by inverting the 2-divided reference clock signal Q1, an inverted 4-divided reference clock signal Q2B by inverting the 4-divided reference clock signal Q2, and an inverted 8-divided reference clock signal Q4B by inverting the 8-divided reference clock signal Q4. The second logic circuit 10-24 may generate a first signal D using the inverted 8-divided reference clock signal Q4B, the 4-divided reference clock signal Q2, and the 2-divided reference clock signal Q1. The second logic circuit 10-24 may also generate a second signal E using the 2-divided reference clock signal Q1, the inverted 4-divided divided reference clock signal Q2B, and the inverted reference clock signal RCLKB. The second selector SEL2 may select one of the first signal D and the second signal E based on the frequency information CCD and generate the pulse signal PULSE.

Figure 3A:
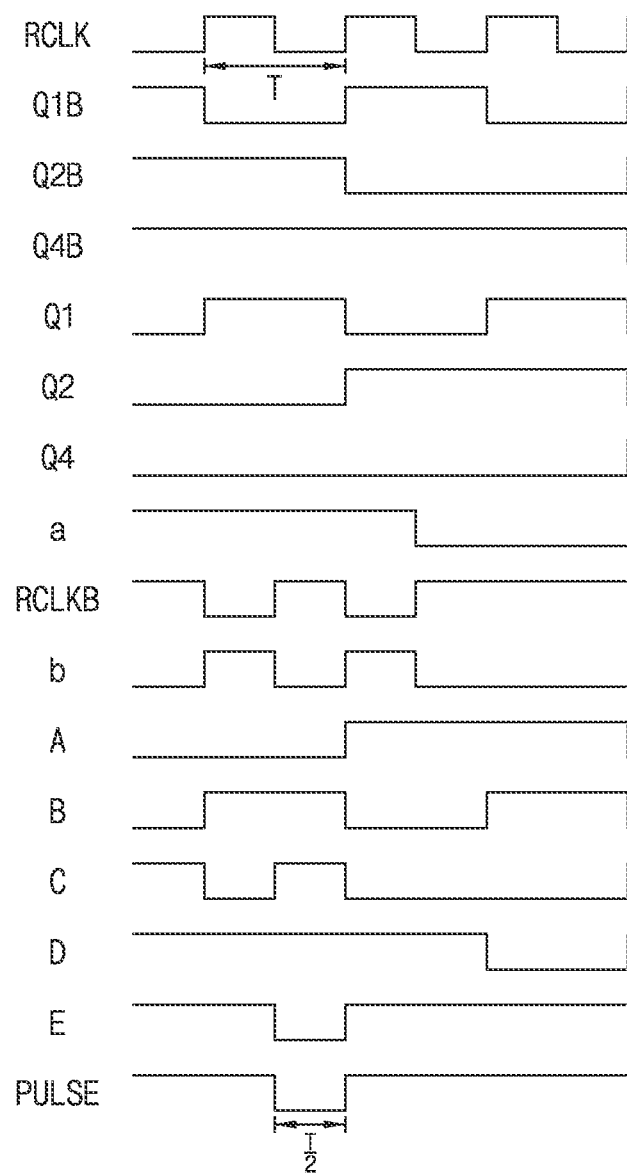
FIGS. 3A and 3B are operation timing diagrams for explaining an operation of the pulse generator shown in FIG. 2 according to an exemplary embodiment.
Figure 3B:
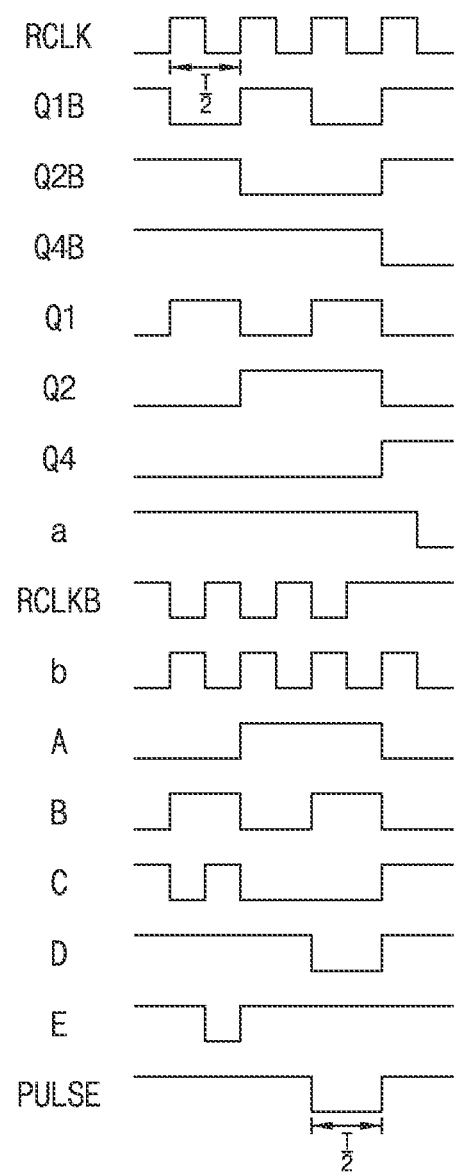

FIGS. 3A and 3B are operation timing diagrams for explaining an operation of the pulse generator shown in FIG. 2 according to an exemplary embodiment. FIG. 3A is an operation timing diagram showing an operation when the reference clock signal RCLK of a low frequency is received, and FIG. 3B is an operation timing diagram showing an operation when the reference clock signal RCLK of a high frequency is received.

The operation of the pulse generator will be described below with reference to FIGS. 2, 3A, and 3B.

The first selector SEL1 may generate a third signal a by selecting one of the inverted 4-divided reference clock signal Q2B and the inverted 8-divided reference clock signal Q4B in response to the frequency information CCD. For example, when the frequency information CCD indicates that the reference clock signal RCLK has a low frequency, the inverted 4-divided reference clock signal Q2B may be selected as the third signal a, and when the frequency information CCD indicates that the reference clock signal RCLK has a high frequency, the inverted 8-divided reference clock signal Q4B may be selected as the third signal a.

The first AND circuit ANDC1 may generate the inverted reference clock signal RCLKB by performing a NAND operation on the reference clock signal RCLK and the third signal a by the first NAND gate NA1, and may generate a fourth signal b by inverting an output of the first NAND gate NA1 by the first inverter I1.

The first flip-flop F/F1 may generate the inverted 2-divided reference clock signal Q1B in response to a rising edge of the fourth signal b.

The second flip-flop F/F2 may generate the inverted 4-divided reference clock signal Q2B in response to a rising edge of the inverted 2-divided reference clock signal Q1B.

The third flip-flop F/F3 may generate the inverted 8-divided reference clock signal Q4B in response to a rising edge of the inverted 4-divided reference clock signal Q2B.

The second AND circuit ANDC2 may generate a fifth signal A by performing a NAND operation on the inverted 8-divided reference clock signal Q4B and the 4-divided reference clock signal Q2 by the second NAND gate NA2, and inverting an output of the second NAND gate NA2 by the inverter I2.

The buffer BUF may generate a sixth signal B. Specifically, the fourth inverter I4 may receive the 2-divided reference clock signal Q1 from the first flip-flop F/F1 and output an inverted 2-divided reference clock signal Q1 to the fifth inverter I5. The fifth inverter I5 may generate the sixth signal B by inverting the output of the inverted 2-divided reference clock signal Q1 from the fourth inverter I4.

The third AND circuit ANDC3 may generate a seventh signal C by performing a NAND operation on the inverted reference clock signal RCLKB and the inverted 4-divided reference clock signal Q2B by the third NAND gate NA3, and inverting an output of the third NAND gate NA3 by the third inverter I3.

The fourth NAND gate NA4 may generate the first signal D by performing a NAND operation on the fifth signal A and the sixth signal B.

The fifth NAND gate NA5 may generate the second signal E by performing a NAND operation on the sixth signal B and the seventh signal C.

The second selector SEL2 may select one of the sixth signal D and the seventh signal E and may generate the pulse signal PULSE in response to the frequency information CCD. For example, when the frequency information CCD indicates that the reference clock signal RCLK has a low frequency, the seventh signal E may be generated as the pulse signal PULSE, and when the frequency information CCD indicates that the reference clock signal RCLK has a high frequency, the sixth signal D may be generated as the pulse signal PULSE.

When the aforementioned operation is performed, if the period of the reference clock signal RCLK is T (e.g., 12.5 ns) as shown in FIG. 3A, that is, if the reference clock signal RCLK of a low frequency is applied, the pulse generator 10-2 may generate the second signal E as the pulse signal PULSE. In this case, the pulse width of the pulse signal PULSE may be T/2 (e.g., 625 ps). On the other hand, as shown in FIG. 3B, when the period of the reference clock signal RCLK is T/2 (e.g., 625 ps), that is, when the reference clock signal RCLK of a high frequency is applied, the pulse generator 10-2 may generate the seventh signal D as the pulse signal PULSE. In this case, the pulse width of the pulse signal PULSE may be T/2 (e.g., 625 ps). As a result, the pulse generator 10-2 may generate the pulse signal PULSE having the same pulse width regardless of the frequency of the reference clock signal RCLK. For example, the pulse generator 10-2 may generate the pulse signal PULSE having a pulse width corresponding to the period T/2 of the reference clock signal RCLK of a high frequency, regardless of the frequency of the reference clock signal RCLK. The periods T or T/2 of the reference clock signal RCL based on which the pulse signal PILSE is generated are only examples, and thus, any other period than T or T/2 may also be used for the pulse generator 10-2 to generate the constant-width pulse signal PULSE, according to embodiments.

Figure 4:
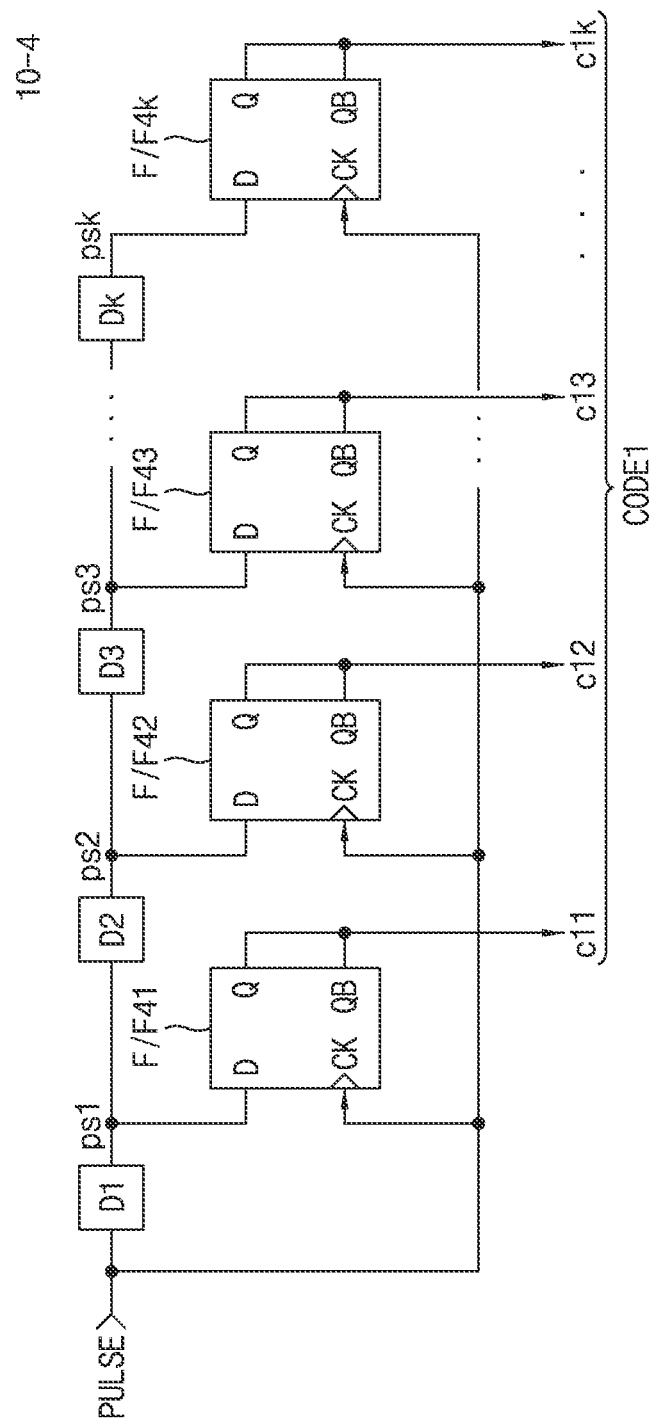
FIG. 4 is a diagram of a code generator according to an exemplary embodiment.

FIG. 4 is a diagram of a code generator according to an exemplary embodiment. The code generator 10-4 may include k delayers D1 to Dk and k fourth flip-flops F/F41 to F/F4$k$. Here, k is an integer greater than or equal to 1.

Referring to FIG. 4, the k delayers D1 to Dk may be connected in series to each other, and may receive the pulse signal PULSE from the pulse generator 10-2. The k delayers D1 to Dk may generate k delayed pulse signals ps1 to psk by sequentially delaying the pulse signal PULSE by a predetermined delay time. The predetermined delay time may be changed depending on changes in a process, a voltage, and/or a temperature.

Referring to FIG. 4, the k fourth flip-flops F/F41 to F/F4$k$ may be connected in parallel to each other, and may receive the k delayed pulse signals ps1 to psk and output the first code CODE1 of k bits in response to the pulse signal PULSE. Each of the k fourth flip-flops F/F41 to F/F4$k$ may include the input terminal D, the clock signal terminal CK, the output terminal Q, and the inverted output terminal QB.

The k fourth flip-flops F/F41 to F/F4k may generate data c11 to c1k by latching the k delayed pulse signals ps1 to psk, respectively, in response to a rising edge of the pulse signal PULSE. The k-bit data c11 to c1k may configure the first code CODE1.

Figure 5:
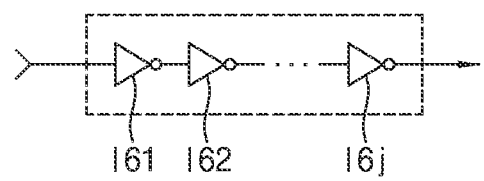
FIG. 5 is a diagram of a delay unit according to an exemplary embodiment.

FIG. 5 is a diagram of a delayer according to an exemplary embodiment. Each of the k delayers D1 to Dk may include j sixth inverters I61 to I6j that are connected in series to each other. Here, j may be an even number.

Referring to FIG. 5, the j sixth inverters I61 to I6j may change the predetermined delay time depending on changes in a process, a voltage, and/or a temperature.

Figure 6A:
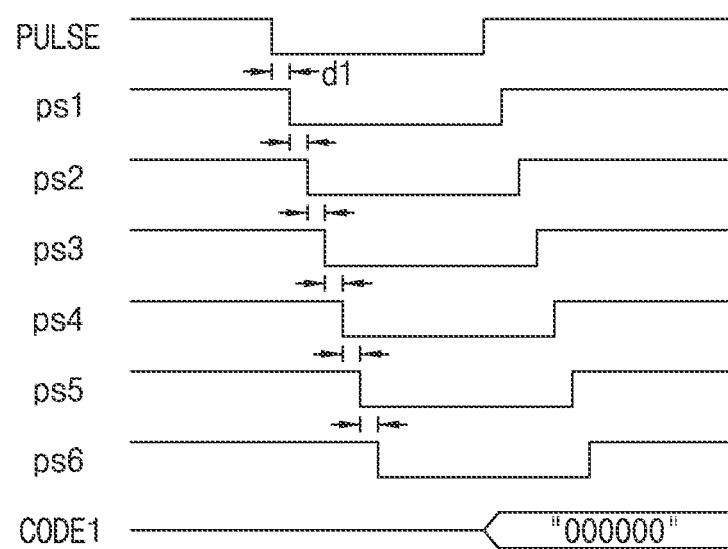
FIGS. 6A to 6C are operation timing diagrams for explaining an operation of a code generator according to an exemplary embodiment.
Figure 6B:
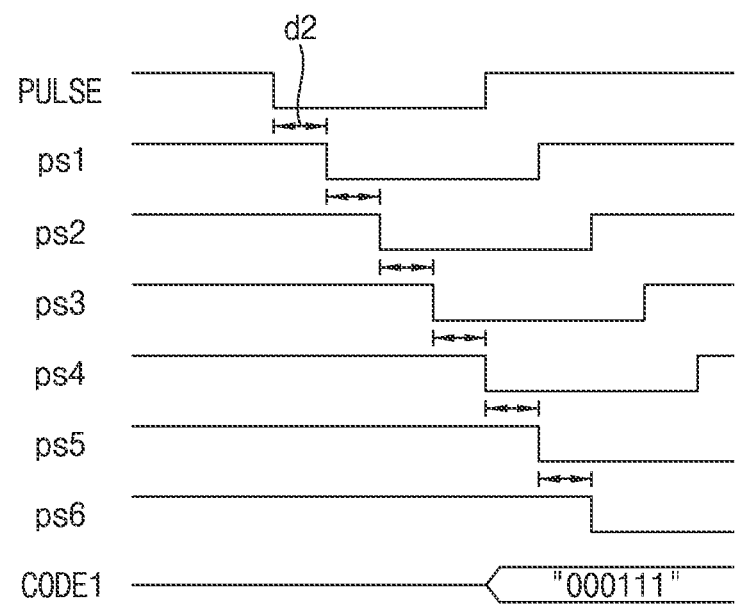
Figure 6C:
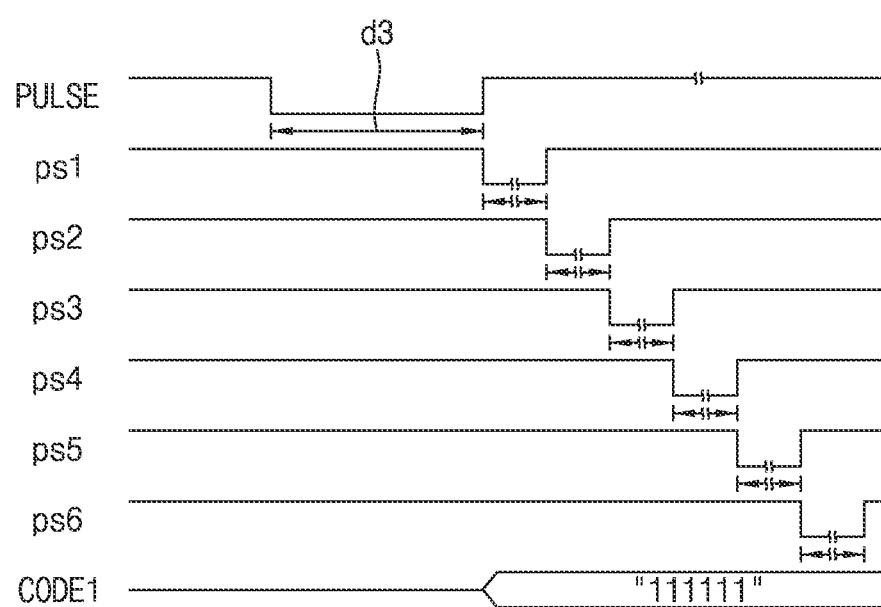

FIGS. 6A to 6C are operation timing diagrams for explaining an operation of a code generator according to an exemplary embodiment. When the code generator 10-4 of FIG. 4 includes six fourth flip-flops F/F41 to F/F46 and six delayers D1 to D6, the code generator 10-4 is configured to generate the 6-bit data c11 to c16 as the first code CODE1. FIG. 6A is an operation timing diagram showing an operation when a predetermined delay time of each of the six delayers D1 to D6 is a first delay time d1; FIG. 6B is an operation timing diagram showing an operation when the predetermined delay time is a second delay time d2; and FIG. 6C is an operation timing diagram showing an operation when the predetermined delay time is a third delay time d3.

Referring to FIGS. 4 to 6A, the six delayers D1 to D6 may receive the pulse signal PULSE and may generate the six delayed pulse signals ps1 to ps6 by delaying the pulse signal PULSE by the first delay time d1. The six fourth flip-flops F/F41 to F/F46 may generate the six delayed pulse signals ps1 to ps6 as the 6-bit data c11 to c16 in response to the rising edge of the pulse signal PULSE. That is, the first code CODE1 of "000000" may be generated because each of the six delayed pulse signals ps1 to ps6 are not triggered by the rising edge of the pulse signal PULSE.

Referring to FIGS. 4, 5, and 6B, when the predetermined delay time of each of the six delayers D1 to D6 is the second delay time d2, the first code CODE1 of "000111" may be generated since delayed pulse signals ps4 to ps6 from the delayers D4 to D6 are triggered by the rising edge of the pulse signal PULSE.

Referring to FIGS. 4, 5, and 6C, when the predetermined delay time of each of the six delayers D1 to D6 is the third delay time d3, the first code CODE1 of "111111" may be generated.

Figure 7:
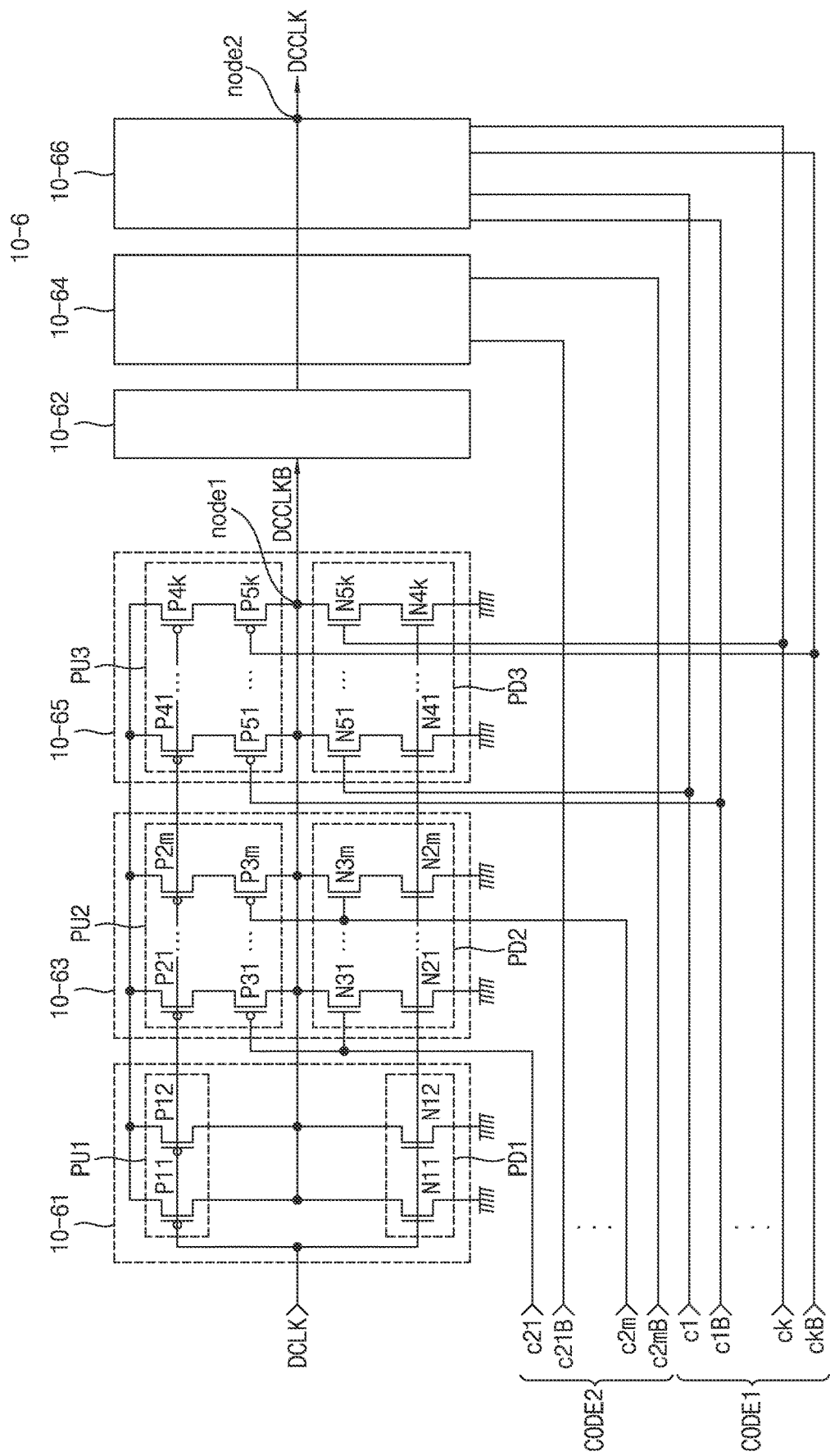
FIG. 7 is a diagram of a duty adjuster according to an exemplary embodiment.

FIG. 7 is a diagram of a duty adjuster according to an exemplary embodiment. The duty adjuster 10-6 may include a seventh inverter 10-61 and an eighth inverter 10-62, and a first adjuster 10-63, a second adjuster 10-64, a third adjuster 10-65 and a fourth adjuster 10-66.

The configuration of the duty adjuster 10-6 shown in FIG. 7 will be described below.

Each of the seventh inverter 10-61 and the eighth inverter 10-62 may include a first pull-up unit PU1 including two first pull-up transistors that are connected between a power voltage VDD and a first node node1, and pull-up the first node node1 or a second node node2 in response to the delay clock signal DCLK or an inverted duty correction clock signal DCCLKB, and a first pull-down unit PD1 including two first pull-down transistors that are connected between the first node node1 or the second node node2 and a ground voltage, and pull-down the first node node1 or the second node node2 in response to the delay clock signal DCLK or the inverted duty correction clock signal DCCLKB. The first pull-up transistors may include a first PMOS transistor P11 and a second PMOS transistor P12 that are connected in parallel between the power voltage VDD and the first node node1 or the second node node2. Each of the first pull-up transistors may have a gate to which the delay clock signal DCLK or the inverted duty correction clock signal DCCLKB is applied. The first pull-down transistors may include a first NMOS transistor N11 and a second NMOS transistor N12 that are connected in parallel between the first node node1 or the second node node2 and the ground voltage. Each of the first pull-down transistors may have a gate to which the delay clock signal DCLK or the inverted duty correction clock signal DCCLKB is applied. The seventh inverter 10-61 may invert the delay clock signal DCLK to generate the inverted duty correction clock signal DCCLKB to the first node node1, and the eighth inverter 10-62 may invert the inverted duty correction clock signal DCCLKB to generate the duty correction clock signal DCCLK to the second node node 2.

Each of the first adjuster 10-63 and the second adjuster 10-64 may include a second pull-up unit PU2 including m second pull-up transistors that are connected in parallel between the power voltage VDD and the first node node1 or the second node node2. The second pull-up transistors are enabled in response to the delay clock signal DCLK or the inverted duty correction clock signal DCCLKB, and pull-up the first node node1 or the second node node2 in response to m-bit data c21 to c2m or m-bit inverted data c21B to c2mB of the second code CODE2. Each of the first adjuster 10-63 and the second adjuster 10-64 may also include a second pull-down unit PD2 including m second pull-down transistors that are connected in parallel between the first node node1 or the second node node2 and the ground voltage. The second pull-down transistors are enabled in response to the delay clock signal DCLK or the inverted duty correction clock signal DCCLKB, and pull-down the first node node1 or the second node node2 in response to the m-bit data c21 to c2m or the m-bit inverted data c21B to c2mB of the second code CODE2. Each of the m second pull-up transistors may include two third and fourth PMOS transistors (P21, P31), . . . , (P2m, P3m) that are connected in series. Each of the m second pull-down transistors may include two third and fourth NMOS transistors (N31, N21), . . . , (N3m, N2m) that are connected in series to each other. The first adjuster 10-63 may be enabled in response to the delay clock signal DCLK and may adjust the slope of the inverted duty correction clock signal DCCLKB in response to the m-bit data c21 to c2m of the second code CODE2. The first adjuster 10-63 may adjust the slope of the rising transition and the slope of the falling transition of the inverted duty correction clock signal DCCLKB in the same manner or differently depending on the number of "1" and "0" of the m-bit data c21 to c2m of the second code CODE2. The second adjuster 10-64 may be enabled in response to the inverted duty correction clock signal DCCLKB and may adjust the slope of the duty correction clock signal DCCLK in response to the m inverted data c21B to c2mB of the second code CODE2. The second adjuster 10-64 may adjust the slope of the rising transition and the slope of the falling transition in the same manner or differently depending on the number of "1" and "0" of the m-bit inverted data c21B to c2mB of the second code CODE2.

Each of the third adjuster 10-65 and the fourth adjuster 10-66 may include a third pull-up unit PU3 including k third pull-up transistors that are connected in parallel between the power voltage VDD and the first node node1 or the second node node2. The third pull-up transistors are enabled in response to the delay clock signal DCLK or the inverted duty correction clock signal DCCLKB, and pull-up the first node node1 or the second node node2 in response to k-bit inverted data c11B to c1kB of the first code CODE1. Each of the third adjuster 10-65 and the fourth adjuster 10-66 may also include a third pull-down unit PD3 including k third pull-down transistors that are connected in parallel between the first node node1 or the second node node2 and the ground voltage. The third pull-down transistors are enabled in response to the delay clock signal DCLK or the inverted duty correction clock signal DCCLKB, and pull-down the first node node1 or the second node node2 in response to the k-bit data c11 to c1k of the first code CODE1. Each of the k third pull-up transistors may include two fifth and sixth PMOS transistors (P41, P51), . . . , (P4k, P5k) that are connected in series. Each of the k third pull-down transistors may include two fifth and sixth NMOS transistors (N51, N41), . . . , (N5k, N4k) that are connected in series. The third adjuster 10-65 may be enabled in response to the delay clock signal DCLK and may adjust the slope of the inverted duty correction clock signal DCCLKB in response to the k-bit data c11 to c1k and the k-bit inverted data c11B to c1kB of the first code CODE1. The fourth adjuster 10-66 may be enabled in response to the inverted duty correction clock signal DCCLKB and may adjust the slope of the duty correction clock signal DCCLK in response to the k-bit data c11 to c1k and the k-bit inverted data c11B to c1kB of the first code CODE1.

Figure 8A:
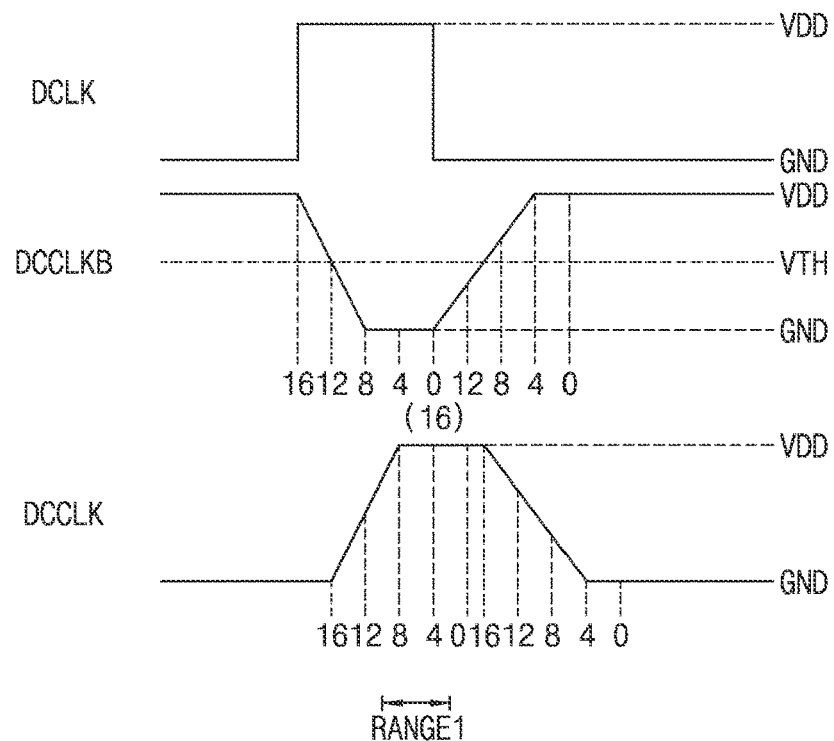
FIGS. 8A and 8B are waveform diagrams for explaining an operation of a duty adjuster according to an exemplary embodiment.
Figure 8B:
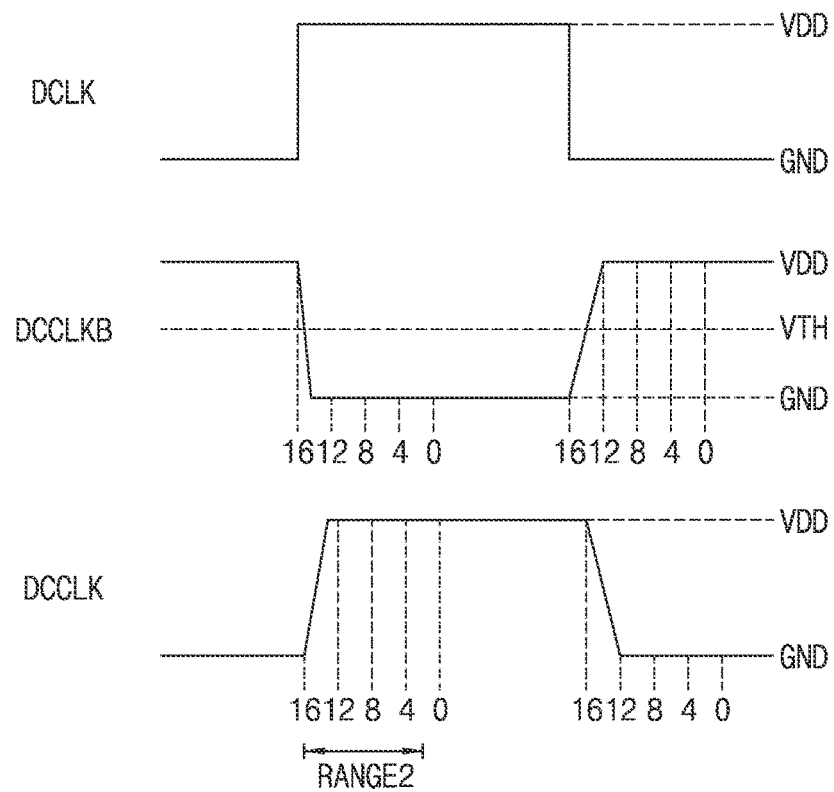

FIGS. 8A and 8B are waveform diagrams for explaining an operation of a duty adjuster according to an exemplary embodiment. Specifically, FIGS. 8A and 8B are diagrams for explaining an operation when the second pull-up unit PU2 of each of the first adjuster 10-63 and the second adjuster 10-64 of FIG. 7 includes eight second pull-up transistors (P21, P31) to (P28, P38) that are connected in parallel, the second pull-down unit PD2 includes eight second pull-down transistors (N31, N21) to (N38, N28) that are connected in parallel, the third pull-up unit PU3 of each of the third adjuster 10-65 and the fourth adjuster 10-66 includes six third pull-up transistors (P41, P51) to (P46, P56) that are connected in parallel, the third pull-down unit PD3 includes six third pull-down transistors (N51, N41) to (N56, N46) that are connected in parallel, the first code CODE1 has 6 bits, and the second code CODE2 has 8 bits. In the drawings, it is assumed that all pull-up transistors and all pull-down transistors are of the same size. VTH may refer to a voltage of a pull-up transistor and a pull-down transistor, and the inverted duty correction clock signal DCCLKB and the duty correction clock signal DCCLK become a rising transition and a falling transition based on the threshold voltage VTH.

Referring to FIG. 8A, when the delay clock signal DCLK of a high frequency is applied, the 6-bit data c11 to c16 of the first code CODE1 is "000000", the six-bit inverted data c11B to c16B is "111111", the 8-bit data c21 to c28 of the second code CODE2 is "11111100", and the 8-bit inverted data c21B to c28B is "00111111". For example, in the case of a high frequency, a high voltage, a low temperature, and the 6-bit data c11 to c16 of "000000" may be generated.

Referring to FIGS. 7 and 8A, when the delay clock signal DCLK becomes rising transition, the first node node1 may be pulled down to a "low" level by turning on first pull-down transistors N11 and N12 of the first pull-down unit PD1 of the seventh inverter 10-61 and six second pull-down transistors (N31, N21) to (N36, N26) of the second pull-down unit PD2 of the first adjuster 10-63, and turning off two second pull-down transistors (N37, N27) and (N38, N28) of the second pull-down unit PD2 of the first adjuster 10-63 and the six third pull-down transistors (N51, N41) to (N56, N46) of the third pull-down unit PD3 of the third adjuster 10-65.

For example, when the 6-bit data c11 to c16 is "111111" and the 8-bit data c21 to c28 is "11111111", all pull-down transistors of the first pull-down unit PD1 to the third pull-down unit PD3 of the seventh inverter 10-61, the first adjuster 10-63, and the third adjuster 10-65 are turned on, that is, the resistance due to the pull-down transistors is at the minimum, the slope of the inverted duty correction clock signal DCCLKB may be 16, which is the maximum slope. Moreover, assuming that the slope is reduced by 1 whenever the number of turned-on pull-down transistors is reduced by 1, when the 6-bit data c11 to c16 is "000000" and the 8-bit data c21 to c28 is "11111100", the slope of the falling transition of the inverted duty correction clock signal DCCLKB may be 8.

On the other hand, when the delay clock signal DCLK becomes a falling transition, the first node node1 may be pulled up to a "high" level by turning on the first pull-up transistors P11 and P12 of the first pull-up unit PU1 of the seventh inverter 10-61 and two second pull-up transistors (P27, P37) and (P28, P38) of the second pull-up unit PU2 of the first adjuster 10-63 and turning off six second pull-up transistors (P21, P31) to (P26, P36) of the second pull-up unit PU2 of the first adjuster 10-63 and six third pull-up transistors (P41, P51) to (P46, P56) of the third pull-up unit PU3 of the third adjuster 10-65. For example, when the six-bit inverted data c11B to c16B is "000000" and the 8-bit data c21 to c28 is "00000000", all pull-up transistors of the first pull-up unit PU1 to the third pull-up unit PU3 of the seventh inverter 10-61, the first adjuster 10-63, and the third adjuster 10-65 are turned on, that is, the resistance due to the pull-up transistors is at the minimum, the slope of the inverted duty correction clock signal DCCLKB may be 16, which is the maximum slope. Moreover, assuming that the slope is reduced by 1 whenever the number of turned-on pull-up transistors is reduced, when the six-bit inverted data c11B to c16B is "111111" and the 8-bit data c21 to c28 is "11111100", the slope of the rising transition of the inverted duty correction clock signal DCCLKB may be 4.

Referring to FIGS. 7 and 8A, when the inverted duty correction clock signal DCCLKB becomes a falling transition, the second node node2 may be pulled up to a "high" level by turning on the two first pull-up transistors P11 and P12 of the first pull-up unit PU1 of the eighth inverter 10-62 and the six second pull-up transistors (P21, P31) to (P26, P36) of the second pull-up unit PU2 of the second adjuster 10-64 and turning off the two second pull-up transistors (P27, P37) and (P28, P38) of the second pull-up unit PU2 of the second adjuster 10-64 and the six third pull-up transistors (P41, P51) to (P46, P56) of the third pull-up unit PU3 of the fourth adjuster 10-66. For example, when the six-bit inverted data c11B to c16B is "000000" and the 8-bit inverted data c21B to c28B is "00000000", all pull-up transistors of the first pull-up unit PU1 to the third pull-up unit PU3 of the eighth inverter 10-62, the second adjuster 10-64, and the fourth adjuster 10-66 are turned on, and assuming that the slope of the inverted duty correction clock signal DCCLKB is 16, which is the maximum slope, when the six-bit inverted data c11B to c16B is "111111" and the 8-bit inverted data c21B to c28B is "00000011", the slope of the rising transition of the duty correction clock signal DCCLK may be 8.

On the other hand, when the inverted duty correction clock signal DCCLKB becomes a rising transition, the second node node2 may be pulled down to a "low" level by turning on the first pull-down transistors N11 and N12 of the first pull-down unit PD1 of the eighth inverter 10-62 and the two second pull-down transistors (N37, N27) and (N38, N28) of the second pull-down unit PD2 of the second adjuster 10-64, and turning off the six second pull-down transistors (N31, N21) to (N36, N26) of the second pull-down unit PD2 of the second adjuster 10-64 and the six third pull-down transistors (NM, N41) to (N56, N46) of the third pull-down unit PD3 of the fourth adjuster 10-66. For example, when the 6-bit data c11 to c16 is "111111" and the 8-bit inverted data c21B to c28B is "11111111", all pull-down transistors of the eighth inverter 10-62, and the first to third pull-down units PD1 to PD3 of the second adjuster 10-64 and the fourth adjuster 10-66 may be turned on, and assuming that the slope of the duty correction clock signal DCCLK is 16, which is the maximum slope, when the 6-bit data c11 to c16 is "000000" and the 8-bit inverted data c21B to c28B is "00000011", the slope of the falling transition of the duty correction clock signal DCCLK may be 4.

Referring to FIG. 8A, when the delay clock signal DCLK of a high frequency is applied and in the case of a high voltage and a low temperature, if the 6-bit data c11 to c16 of "000000" is generated, the seventh inverter 10-61 and the eighth inverter 10-62 of the duty adjuster 10-6 are always operated and the third adjuster 10-65 and the fourth adjuster may not operate, and thus the first adjuster 10-63 and the second adjuster 10-64 may adjust the slope of the duty correction clock signal DCCLK to one slope unit within a first adjustment range RANGE1 of 2 to 10.

Referring to FIG. 8B, when the delay clock signal DCLK of a low frequency is applied, the 6-bit data c11 to c16 of the first code CODE1 is "111111", the six-bit inverted data c11B to c16B is "000000", the 8-bit data c21 to c28 of the second code CODE2 is "11111100", and the 8-bit inverted data c21B to c28B is "00000011". In this case, the slope of the rising transition of the inverted duty correction clock signal DCCLKB and the duty correction clock signal DCCLK may be 14, and the slope of the falling transition thereof may be 12. For example, in the case of a low frequency, a low voltage, and a high temperature, 6-bit data c11 to c16 of "111111" may be generated.

Moreover, when the delay clock signal DCLK of a low frequency is applied and in the case of a low voltage and a high temperature, if the 6-bit data c11 to c16 of "111111" is generated, the seventh inverter 10-61 and the eighth inverter 10-62 of the duty adjuster 10-6 may always be operated and the third adjuster 10-65 and the fourth adjuster 10-66 may always be operated. Thus, the seventh inverter 10-61, the eighth inverter 10-62, the first adjuster 10-65, the second adjuster 10-64, the third adjuster 10-65 and the fourth adjuster 10-66 may adjust the slope of the duty correction clock signal DCCLK to one slope unit within a second adjustment range RANGE2 of 2 to 16.

Thus, the duty adjustment circuit 10 according to an exemplary embodiment may increase an adjustment range of the slope of the duty correction clock signal DCCLK with an increase in the number of bits of "1" of k-bit data of the first code CODE1 generated by reflecting a change in a frequency, and changes in a process, a voltage, and/or a temperature, and may adjust the slope of the duty correction clock signal DCCLK in the same slope unit within the adjustment range.

Figure 9:
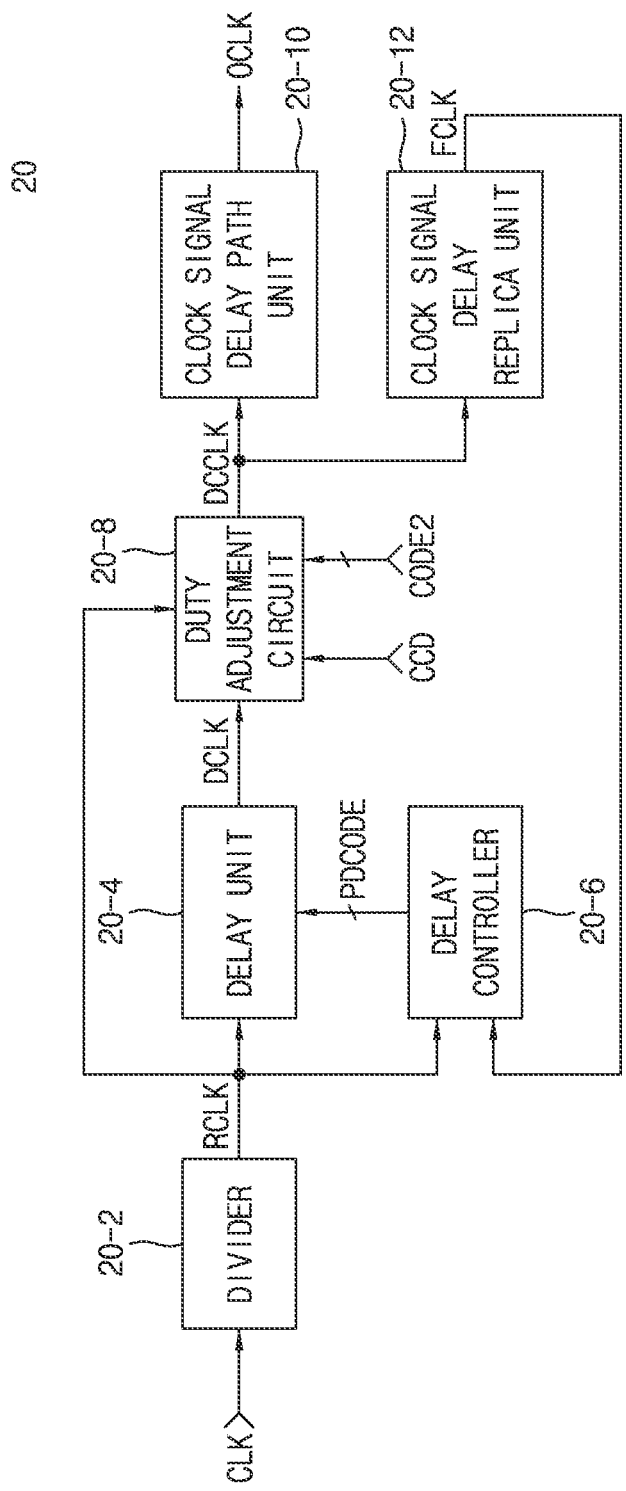
FIG. 9 is a block diagram of a delay locked loop circuit according to an exemplary embodiment of the inventive concept.

FIG. 9 is a block diagram of a delay locked loop circuit according to an exemplary embodiment. A delay locked loop circuit 20 may include a divider 20-2, a delay unit 20-4, a delay controller 20-6, a duty adjustment circuit 20-8, a clock signal delay path unit 20-10, and a clock signal delay replica unit 20-12.

The respective functions of the blocks shown in FIG. 9 will be described below.

The divider 20-2 may divide an input clock signal CLK and may generate the divided clock signal as the reference clock signal RCLK.

The delay unit 20-4 may include a plurality of delay cells that are connected in series and may generate the delay clock signal DCLK by variably delaying the reference clock signal RCLK according to a phase difference detection code PDCODE.

The delay controller 20-6 may detect a phase difference of the reference clock signal RCLK and a feedback clock signal FCLK and may generate the phase difference detection code PDCODE corresponding to the phase difference.

The duty adjustment circuit 20-8 may correspond to the duty adjustment circuit 10 described with reference to FIGS. 1 to 8B. The duty adjustment circuit 20-8 may generate the pulse signal PULSE having the same pulse width regardless of the frequency of the reference clock signal RCLK based on the frequency information CCD, generate the predetermined number of delayed pulse signals by delaying the pulse signal PULSE, receive the predetermined number of delayed pulse signals and generate the first code CODE1 of the predetermined number of bits in response to the pulse signal PULSE. The duty adjustment circuit 20-8 may generate the duty correction clock signal DCCLK by adjusting the slope of the rising transition and the falling transition of the delay clock signal DCLK according to the first code CODE1 and the second code CODE2. A detailed description of the duty adjustment circuit 20-8 is provided above with reference to FIGS. 1 to 8B.

The clock signal delay path unit 20-10 may generate an output clock signal OCLK by delaying the duty correction clock signal DCCLK by a first predetermined time. For example, the clock signal delay path unit 20-10 may generate the output clock signal OCLK having the same frequency and the same phase as those of the input clock signal CLK.

The clock signal delay replica unit 20-12 may generate the feedback clock signal FCLK by delaying the duty correction clock signal DCCLK by the first predetermined time.

Figure 10:
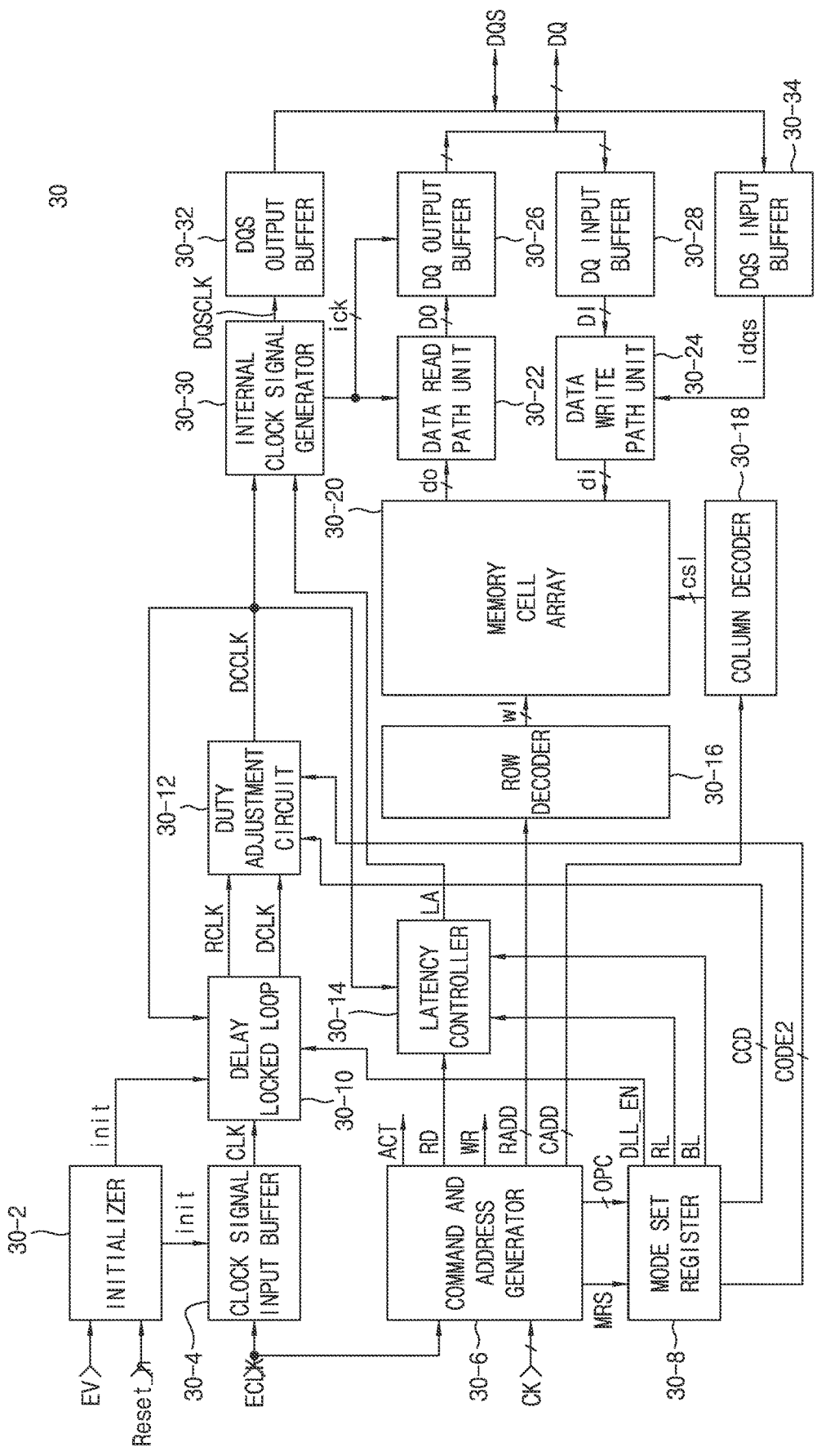
FIG. 10 is a block diagram of a semiconductor memory device according to an exemplary embodiment.

FIG. 10 is a block diagram of a semiconductor memory device according to an exemplary embodiment. A semiconductor memory device 30 may include an initializer 30-2, a clock signal input buffer 30-4, a command and address generator 30-6, a mode set register 30-8, a delay locked loop 30-10, a duty adjustment circuit 30-12, a latency controller 30-14, a row decoder 30-16, a column decoder 30-18, a memory cell array 30-20, a data read path unit 30-22, a data write path unit 30-24, a data DQ output buffer 30-26, a DQ input buffer 30-28, an internal clock signal generator 30-30, a data strobe signal (DQS) output buffer 30-32, and a DQS input buffer 30-34.

The respective functions of the blocks shown in FIG. 10 will be described below.

The initializer 30-2 may generate an initialization signal init when a reset signal Reset_n of a "high" level is applied from the outside after an external power voltage EV supplied from the outside reaches a target voltage level.

The clock signal input buffer 30-4 may generate the input clock signal CLK by buffering an external clock signal ECLK applied from the outside.

The command and address generator 30-6 may generate a mode set command MRS, an active command ACT, a read command RD, and a write command WR by decoding a command and address CA in response to receiving the external clock signal ECLK. In addition, the command and address generator 34 may generate an address signal included in the command and address CA as a mode set code OPC in response to the mode set command MRS, generate an address signal included in the command and address CA as a row address RADD in response to the active command ACT, and generate an address signal included in the command and address CA as a column address CADD in response to the read command RD or the write command WR.

The mode set register 30-8 may store the mode set code OPC in response to receiving the mode set command MRS from the command and address generator 30-6, and may set a delay locked loop enable signal DLL_EN, a read latency RL, a burst length BL, the frequency information CCD, and the second code CODE2.

The delay locked loop 30-10 may generate the delay clock signal DCLK by performing a delay locked operation in response to receiving the initialization signal init from the initializer 30-2 and the delay locked loop enable signal DLL_EN from the mode set register 30-8, and may generate the feedback clock signal FCLK synchronized with the input clock signal CLK. The delay locked loop 30-10 may perform the delay locked operation when the delay locked loop enable signal DLL_EN is generated, regardless of the initialization signal init. The delay locked loop 30-10 may have the configuration in which the duty adjustment circuit 20-8 and the clock signal delay path unit 20-10 are excluded from the delay locked loop circuit 20 shown in FIG. 9. In FIG. 10, the internal clock signal generator 30-30 and the DQS output buffer 30-32 or the DQ output buffer 30-36 may be included in the clock signal delay path unit 20-10, and the clock signal delay replica unit 20-12 may generate the feedback clock signal FCLK by delaying the duty correction clock signal DCCLK by a sum of the delay time of the clock signal input buffer 30-4, the delay time of the internal clock signal generator 30-30, and the delay time of the DQS output buffer 30-32 or the DQ output buffer 30-34 of FIG. 10.

The duty adjustment circuit 30-12 may correspond to the duty adjustment circuit 10 or 20-8 described with reference to FIGS. 1 to 9. A detailed description of the duty adjustment circuit 30-12 will be easily understood with reference to FIGS. 1 to 9.

Based on receiving the read command RD from the command and address generator 30-6, the latency controller 30-14 may generate a latency signal LA that is activated after being delayed by the number of clock cycles corresponding to a value of the read latency RL using the duty correction clock signal DCCLK and is deactivated after being delayed by the sum of the number of clock cycles corresponding to the value of the read latency RL and the number of clock cycles corresponding to a value of the burst length BL. The latency controller 30-14 may generate the latency signal LA, which is activated while data DQ is output through the DQ output buffer 30-26 using the duty correction clock signal DCCLK, the read latency RL, and the burst length BL in response to the read command RD.

The row decoder 30-16 may generate a plurality of word line selection signals w1 by decoding the row address RADD.

The column decoder 30-18 may generate a plurality of column selection signals cs1 by decoding the column address CADD from the command and address generator 30-6.

The memory cell array 30-20 may include a plurality of memory cells connected between a plurality of word lines selected according to the plurality of word line selection signals w1 and a plurality of bit lines selected according to the plurality of column selection signals cs1. The memory cell array 30-20 may output read data do from one or more memory cells selected according to the plurality of word line selection signals w1 and the plurality of column selection signals cs1 in response to the read command RD, and may input write data di to one or more memory cells selected according to the plurality of word line selection signals w1 and the plurality of column selection signals cs1 in response to the write command WR.

The data read path unit 30-22 may receive the read data do output from the memory cell array 30-20 and may generate the read data do as output data DO using an internal clock signal clk.

The data write path unit 30-24 may receive input data DI from the DQ input buffer 30-28 and may output the write data di to a memory cell array 44 in response to an internal data strobe signal idqs.

The DQ output buffer 30-26 may generate data DQ by buffering output data DO in response to the internal clock signal ick from the internal clock signal generator 30-30.

The DQ input buffer 30-28 may generate the input data DI by buffering the data DQ from the DQ output buffer 30-26.

The internal clock signal generator 30-30 may generate a DQS clock signal DQSCLK and the internal clock signal ick using the duty correction clock signal DCCLK in response to the latency signal LA. The internal clock signal ick may include an internal clock signal c1$k$0 having a phase difference of 0 degrees from the duty correction clock signal DCCLK, and an internal clock signal clk180 having a phase difference of 180 degrees therefrom. The internal clock signal ick may further include an internal clock signal ick90 having a phase difference of 90 degrees from the duty correction clock signal DCCLK, and an internal clock signal ick270 having a phase difference of 270 degrees therefrom.

The DQS output buffer 30-32 may generate a data strobe signal DQS synchronized with the external clock signal ECLK by buffering the DQS clock signal DQSCLK during a period in which the latency signal LA is activated.

The DQS input buffer 30-34 may generate the internal data strobe signal idqs by buffering the data strobe signal DQS received from the outside.

Figure 11:
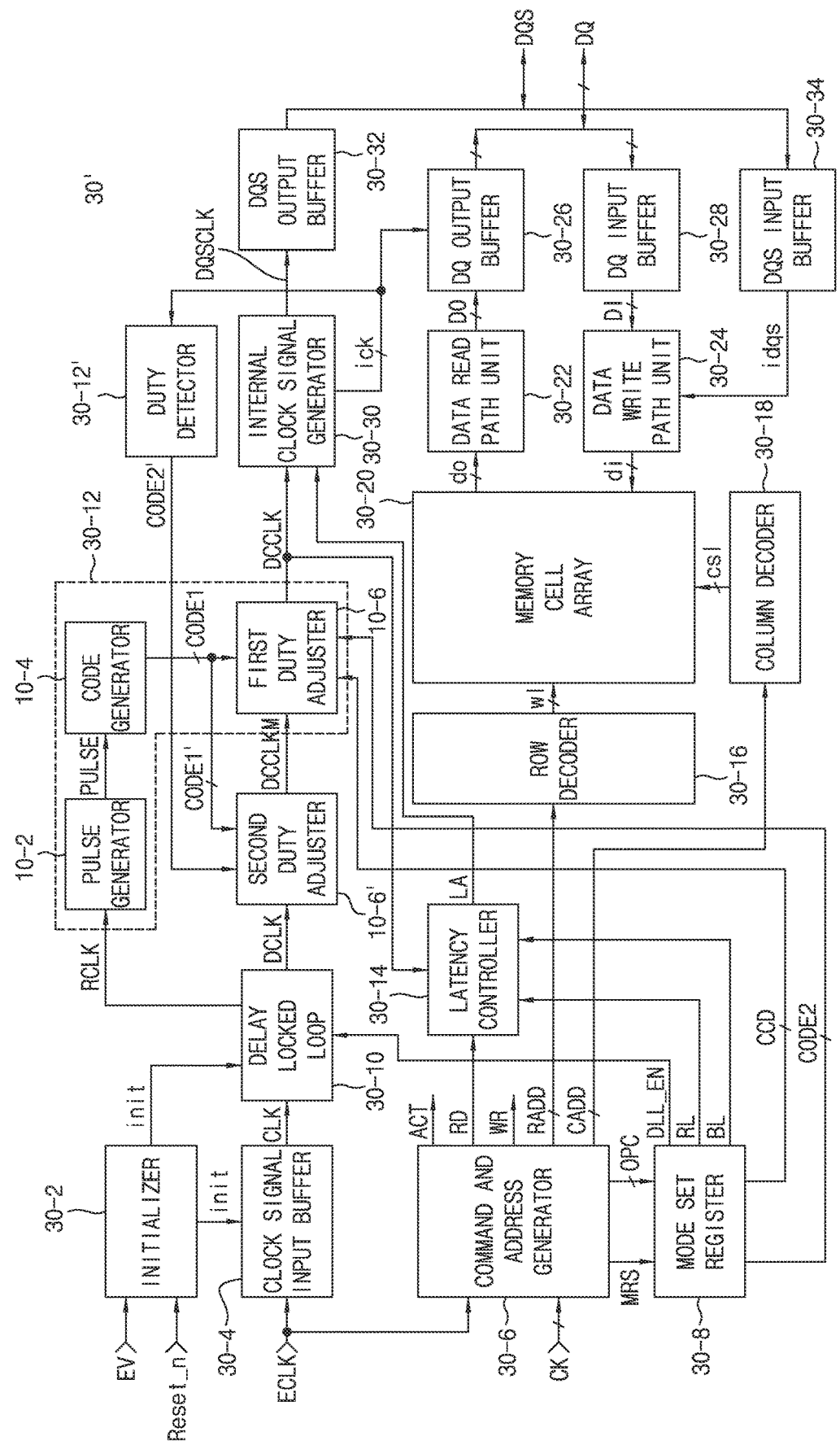
FIG. 11 is a block diagram of a semiconductor memory device according to an exemplary embodiment.

FIG. 11 is a block diagram of a semiconductor memory device according to an exemplary embodiment. A semiconductor memory device 30' may further include a second duty adjuster 10-6' and a duty detector 30-12' in addition to the configuration of the semiconductor memory device 30 of FIG. 10.

The respective functions of the added blocks shown in FIG. 11 will be described below.

The duty adjustment circuit 30-12 may have the same configuration as the duty adjustment circuit 10 shown in FIG. 1, and the code generator 10-4 may generate a third code CODE1' that is the same as the first code CODE1. In another example, the code generator 10-4 may generate the third code CODE1' except for at least lower significant 1 bit of the first code CODE1. A first duty adjuster 10-6 may generate the duty correction clock signal DCCLK by adjusting the slopes of the rising transition and the falling transition of an intermediate duty correction clock signal DCCLKM according to the first code CODE1 and the second code CODE2.

The second duty adjuster 10-6' may have the same configuration as the first duty adjuster 10-6. Fourth code CODE2' may be applied to a first adjuster 10-63' and a second adjuster 10-64' of the second duty adjuster 10-6', and the third code CODE1' may be applied to the third adjuster 10-65' and the fourth adjuster 10-66'. The second duty adjuster 10-6' may generate the intermediate duty correction clock signal DCCLKM by adjusting the slopes of the rising transition and the falling transition of the delay clock signal DCLK according to the third code CODE1' and the fourth code CODE2'.

The duty detector 30-12' may generate a first pump voltage and a second pump voltage by performing a pumping operation in response to two pairs of internal clock signals ick0 and ick180 or ick 90 and ick 270, each pair having a phase difference of 180 degrees therebetween, respectively. The duty detector 30-12' may generate a comparison output signal by comparing the first pump voltage and the second pump voltage, and may generate the fourth code CODE2' by performing an up-counting or a down-counting operation according to the comparison output signal.

Figure 12:
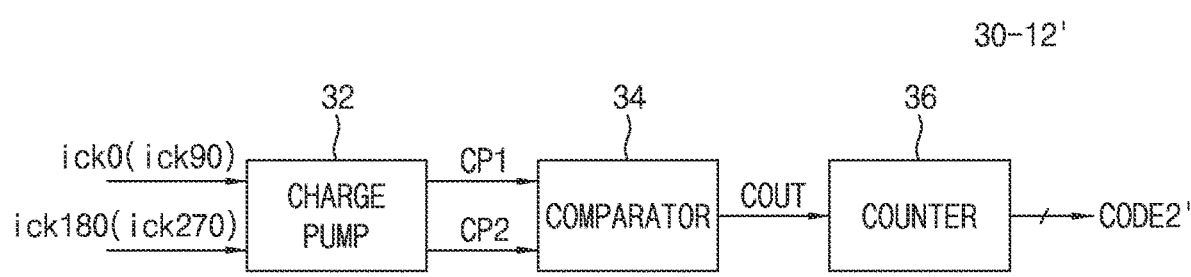
FIG. 12 is a block diagram of a duty detector according to an exemplary embodiment.

FIG. 12 is a block diagram of a duty detector according to an exemplary embodiment. The duty detector 30-12' may include a charge pump 32, a comparator 34, and a counter 36.

The respective functions of the blocks shown in FIG. 12 will be described below.

The charge pump 32 may generate the first pump voltage CP1 by performing the pumping operation in response to the internal clock signal ick0 or ick90 and may generate the second pump voltage CP2 by performing the pumping operation in response to the internal clock signal ick180 or ick270.

The comparator 34 may generate the comparison output signal COUT by comparing the first pump voltage CP1 and the second pump voltage CP2.

The counter 36 may generate the fourth code CODE2' by performing the up-counting or the down-counting operation in response to the comparison output signal COUT.

Figure 13A:
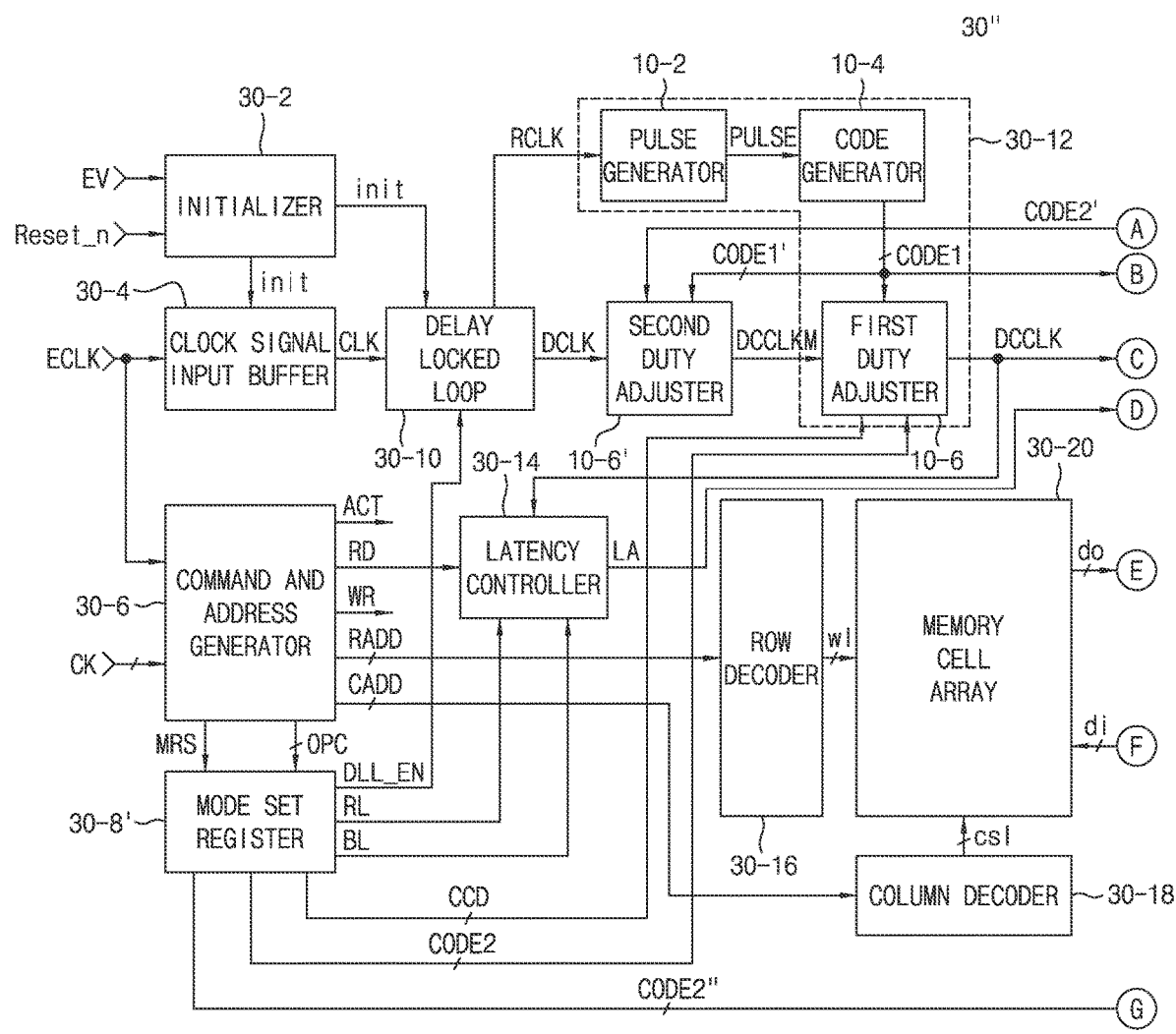
FIGS. 13A and 13B are a block diagram of a semiconductor memory device according to an exemplary embodiment.
Figure 13B:
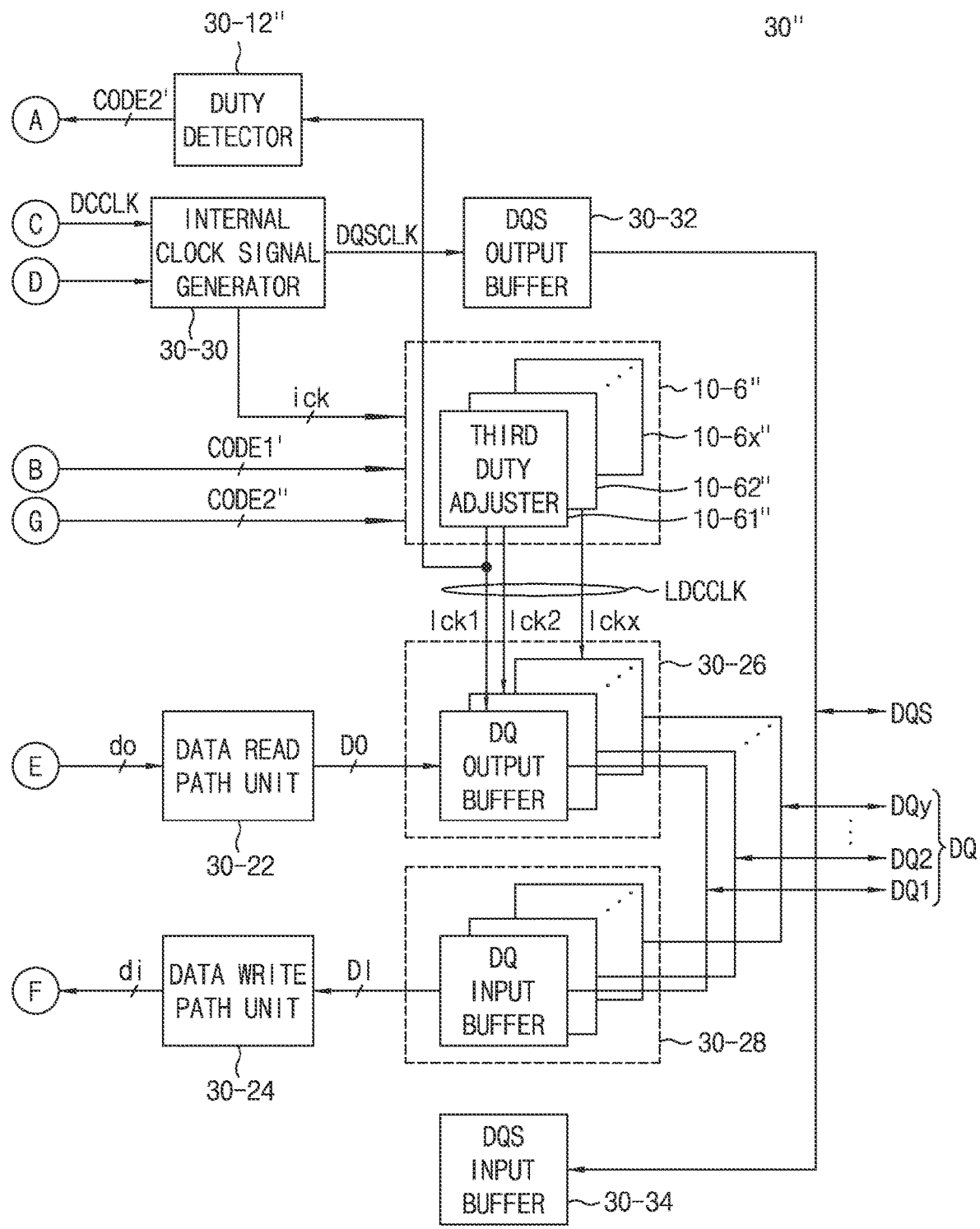

FIGS. 13A and 13B are a block diagram of a semiconductor memory device according to an exemplary embodiment. A semiconductor memory device 30" may further include a third duty adjuster 10-6" (shown in FIG. 13B) in addition to the semiconductor memory device 30' of FIG. 11. The semiconductor memory device 30" may include a duty detector 30-12" instead of the duty detector 30-12', and may include a mode set register 30-8' instead of the mode set register 30-8. The third duty adjuster 10-6" may include x third duty adjusters 10-61" to 10-6x", the DQ output buffer 30-26 may include y DQ output buffers, and the DQ input buffer 30-28 may include y DQ input buffers. Here, y may be greater than x. The y DQ output buffers may be disposed in x different regions.

The respective functions of the added or substituted blocks compared with the blocks of FIG. 13 will be described below.

The mode set register 30-8' may receive the mode set code OPC and may additionally set a fifth code CODE2" in response to the mode set command MRS from the command and address generator 30-6.

Each of the x third duty adjusters 10-61" to 10-6x" may have the same configuration as that of the first duty adjuster 10-6. The fifth code CODE2" may be applied to a first one of the x third duty adjusters 10-63" and a second one of the x third duty adjusters 10-64" among the x third duty adjusters 10-61" to 10-6x". The third code CODE1' may be applied to a third one of the x third duty adjusters 10-65" and a fourth one of the x third duty adjusters 10-66". Each of the x third duty adjusters 10-61" to 10-6x" may generate local internal clock signals lck1 to lckx by adjusting the slopes of the rising transition and the falling transition of the internal clock signal ick according to the third code CODE1' and the fifth code CODE2". The local internal clock signals lck1 to lckx may be a local duty correction clock signal LDCCLK. Each of the local internal clock signals lck1 to lckx may include at least two local internal clock signals lck0 and lck180 or lck90 and lck270, each pair having a phase difference of 180 degrees therebetween.

The duty detector 30-12" may generate a first pump voltage and a second pump voltage by performing a pumping operation in response to the two pairs of local internal clock signals lck0 and lck180 or lck90 and lck270, each pair having a phase difference of 180 degrees therebetween, and respective phase differences from the local duty correction clock signal LDCCLK (e.g., 0, 90, 180 and 270 degrees). The duty detector 30-12" may generate a comparison output signal by comparing the first pump voltage and the second pump voltage, and may generate the fourth code CODE2' by performing an up-counting operation or a down-counting operation according to the comparison output signal.

The y DQ output buffers may generate data DQ1 to DQy by buffering the output data DO in response to the local internal clock signal output from a duty adjuster disposed in a corresponding region of the local internal clock signals lck1 to lckx.

The x DQ input buffers may generate the input data DI by buffering data DQ1 to DQy.

According to exemplary embodiments of the disclosure, the duty adjustment circuit may accurately correct a duty cycle (or a duty ratio) of the output clock signal by at least 50% even if the frequency of an input clock signal besides a process, a voltage, and a temperature are changed.

Thus, the reliability of operations of a duty adjustment circuit, and a delay locked loop circuit and a semiconductor memory device including the same may be improved.

While the embodiments of the disclosure have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limiting the scope of the disclosure.

What is claimed is:

1. A duty adjustment circuit comprising:
    a pulse generator configured to generate a pulse signal at a constant pulse width regardless of a frequency of a reference clock signal, based on frequency information;
    a code generator configured to generate a first predetermined number of delayed pulse signals by delaying the pulse signal, as a first code in response to the pulse signal; and
    a duty adjuster configured to receive a delay clock signal, and generate a duty correction clock signal by adjusting a slope of rising transition and a slope of falling transition of the delay clock signal based on the first code and a second code.

2. The duty adjustment circuit of claim 1, wherein the pulse generator comprises:
    a first logic circuit unit configured to:
        receive the reference clock signal and generate an inverted reference clock signal by inverting the reference clock signal; and
        generate a 2-divided reference clock signal, a 4-divided reference clock signal, an inverted 4-divided reference clock signal, and an inverted 8-divided reference clock signal by dividing the reference clock signal; and
    a second logic circuit unit configured to:

generate a first signal using the inverted 8-divided reference clock signal, the 4-divided reference clock signal, and the 2-divided reference clock signal;

generate a second signal using the 2-divided reference clock signal, the inverted 4-divided reference clock signal, and the inverted reference clock signal; and generate the pulse signal by selecting one of the first signal and the second signal based on the frequency information.

3. The duty adjustment circuit of claim 2, wherein the first logic circuit unit comprises:

a first selector configured to generate a third signal by selecting one of the inverted 4-divided reference clock signal and the inverted 8-divided reference clock signal based on the frequency information;

a first AND circuit configured to generate the inverted reference clock signal by performing a NAND operation on the reference clock signal and the third signal and generate a fourth signal by inverting the inverted reference clock signal;

a first divider configured to generate the 2-divided reference clock signal and an inverted 2-divided reference clock signal by dividing the second signal;

a second divider configured to generate the 4-divided reference clock signal and the inverted 4-divided reference clock signal by dividing the inverted 2-divided reference clock signal; and a third divider configured to generate the inverted 8-divided reference clock signal by dividing the inverted 4-divided reference clock signal.

4. The duty adjustment circuit of claim 2, wherein the second logic circuit unit comprises:

a second AND circuit configured to generate a fifth signal by performing an AND operation on the inverted 8-divided reference clock signal and the 4-divided reference clock signal;

a buffer configured to generate a sixth signal by buffering the 4-divided reference clock signal;

a third AND circuit configured to generate a seventh signal by performing the AND operation on the inverted reference clock signal and the inverted 4-divided reference clock signal;

a first NAND circuit configured to generate the first signal by performing a NAND operation on the fifth signal and the sixth signal;

a second NAND circuit configured to generate the second signal by performing the NAND operation on the sixth signal and the seventh signal; and a second selector configured to output one of the first signal and the second signal as the pulse signal based on the frequency information.

5. The duty adjustment circuit of claim 1, wherein the code generator comprises:

one or more delayers that are connected in series and are configured to generate the first predetermined number of delayed pulse signals by delaying the pulse signal; and one or more flip-flops that are connected in parallel and are configured to generate the first code including a first predetermined number of bits by latching the first predetermined number of delayed pulse signals in response to the pulse signal.

6. The duty adjustment circuit of claim 5, wherein each of the one or more delayers comprises an even number of inverters that are connected in series.

7. The duty adjustment circuit of claim 1, wherein the duty adjuster comprises:

a first inverter configured to invert the delay clock signal to generate an inverted duty correction clock signal to a first node;

a second inverter configured to invert the inverted duty correction clock signal to generate the duty correction clock signal to a second node;

a first adjuster enabled in response to the delay clock signal and configured to adjust a first slope of rising transition and a first slope of falling transition of the inverted duty correction clock signal in response to the second code including a second predetermined number of bits;

a second adjuster enabled in response to the inverted duty correction clock signal and configured to adjust a second slope of rising transition and a second slope of falling transition of the duty correction clock signal in response to an inverted second code, the inverted second code including the second predetermined number of bits that are inverted;

a third adjuster enabled in response to the delay clock signal and configured to adjust the first slope of rising transition and the first slope of falling transition of the inverted duty correction clock signal in response to the first code and an inverted first code, the inverted first code including a first predetermined number of bits that are inverted; and a fourth adjuster enabled in response to the inverted duty correction clock signal and configured to adjust the second slope of rising transition and the second slope of falling transition of the duty correction clock signal in response to the first code and the inverted first code.

8. The duty adjustment circuit of claim 7, wherein each of the first adjuster and the second adjuster comprises:

a first pull-up unit comprising a second predetermined number of first pull-up transistors that are connected in parallel between a power voltage and the first node or the second node, the first pull-up transistors being enabled in response to the delay clock signal or the inverted duty correction clock signal, and configured to pull-up the first node or the second node in response to the second code or the inverted second code; and a first pull-down unit comprising a second predetermined number of first pull-down transistors that are connected in parallel between the first node or the second node and a ground voltage, the first pull-down transistors being enabled in response to the delay clock signal or the inverted duty correction clock signal, and configured to pull-down the first node or the second node in response to the second code or the inverted second code, wherein each of the third adjuster and the fourth adjuster comprises:

a second pull-up unit comprising a first predetermined number of second pull-up transistors that are connected in parallel between the power voltage and the first node or the second node, the second pull-up transistors being enabled in response to the delay clock signal or the inverted duty correction clock signal, and configured to pull-up the first node or the second node in response to the first code or the inverted first code; and a second pull-down unit comprising a first predetermined number of second pull-down transistors that are connected in parallel between the first node and the ground voltage, the second pull-down transistors being enabled in response to the delay clock signal or the inverted duty correction clock signal, and configured to pull-down the first node or the second node in response to the first code or the inverted first code.

9. The duty adjustment circuit of claim 8, wherein each of the first pull-up transistors and the second pull-up transistors comprises two PMOS transistors that are connected in series; and wherein each of the first pull-down transistors and the second pull-down transistors comprises two NMOS transistors that are connected in series.

10. A delay locked loop circuit comprising:
a divider configured to divide an input clock signal and generate a divided input clock signal as a reference clock signal;
a delay unit configured to generate a delay clock signal by variably delaying the reference clock signal according to a phase difference detection code;
a delay controller configured to detect a phase difference between the reference clock signal and a feedback clock signal and generate the phase difference detection code corresponding to the phase difference;
a duty adjustment circuit configured to generate a pulse signal having a constant pulse width regardless of a frequency of the reference clock signal, based on frequency information,
generate a first predetermined number of delayed pulse signals by delaying the pulse signal, as a first code in response to the pulse signal, and
generate a duty correction clock signal by adjusting a slope of rising transition and a slope of falling transition of the delay clock signal according to the first code and a second code;
a clock signal delay path unit configured to generate an output clock signal by delaying the duty correction clock signal by a predetermined time; and
a clock signal delay replica unit configured to generate the feedback clock signal by delaying the duty correction clock signal by the predetermined time.

11. The delay locked loop circuit of claim 10, wherein the duty adjustment circuit comprises:
a pulse generator configured to generate the pulse signal at the constant pulse width regardless of the frequency of the reference clock signal based on the frequency information;
a code generator configured to generate the first predetermined number of delay pulse signals by delaying the pulse signal and generate the first predetermined number of delay pulse signals as the first code including a first predetermined number of bits in response to the pulse signal; and
a duty adjuster configured to receive the delay clock signal and generate the duty correction clock signal by adjusting the slope of the delay clock signal based on the first code and the second code including a second predetermined number of bits.

12. The delay locked loop circuit of claim 11, wherein the pulse generator comprises:
a first logic circuit unit configured to receive the reference clock signal, generate an inverted reference clock signal by inverting the reference clock signal, and generate a 2-divided reference clock signal, a 4-divided reference clock signal, an inverted 4-divided reference clock signal, and an inverted 8-divided reference clock signal by dividing the reference clock signal; and
a second logic circuit unit configured to generate a first signal using the inverted 8-divided reference clock signal, the 4-divided reference clock signal, and the 2-divided reference clock signal, generate a second signal using the 2-divided reference clock signal, the inverted 4-divided reference clock signal, and the inverted reference clock signal, and generate the pulse signal by selecting one of the first signal and the second signal based on the frequency information.

13. The delay locked loop circuit of claim 11, wherein the code generator comprises:
one or more delayers that are connected in series and are configured to generate the first predetermined number of delayed pulse signals by delaying the pulse signal; and
one or more flip-flops that are connected in parallel and are configured to receive the first predetermined number of delayed pulse signals and to generate the first code including the first predetermined number of bits in response to the pulse signal.

14. The delay locked loop circuit of claim 11, wherein the duty adjuster comprises:
a first inverter configured to invert the delay clock signal to generate an inverted duty correction clock signal to a first node;
a second inverter configured to invert the inverted duty correction clock signal to generate the duty correction clock signal to a second node;
a first adjuster enabled in response to the delay clock signal and configured to adjust a first slope of rising transition and a first slope of falling transition of the inverted duty correction clock signal in response to the second code;
a second adjuster enabled in response to the inverted duty correction clock signal and configured to adjust a second slope of rising transition and a second slope of falling transition of the duty correction clock signal in response to an inverted second code, the inverted second code including the second predetermined number of bits that are inverted;
a third adjuster enabled in response to the delay clock signal and configured to adjust the first slope of rising transition and the first slope of falling transition of the inverted duty correction clock signal in response to the first code and an inverted first code, the inverted first code including the first predetermined number of bits that are inverted; and
a fourth adjuster enabled in response to the inverted duty correction clock signal and configured to adjust the second slope of rising transition and the second slope of falling transition of the duty correction clock signal in response to the first code and the inverted first code.

15. A semiconductor memory device comprising:
a clock signal input buffer configured to generate an input clock signal by buffering an external clock signal applied from an outside;
a command and address generator configured to generate a mode set command, an active command, a read command, and a write command by decoding a command and address, generate an address signal included in the command and address as a mode set code in response to the mode set command, generate the address signal as a row address in response to the active command, and generate the address signal as a column address in response to the read command or the write command;
a mode set register configured to receive the mode set code in response to the mode set command and set read latency, a burst length, frequency information, and a second code; and a delay locked loop configured to generate a reference clock signal by dividing the input clock signal, generate a feedback clock signal by delaying a duty correction clock signal by a predetermined time, detect a phase difference between the reference clock signal and the feedback clock signal to generate a phase difference detection code corresponding to the phase difference, and generate a delay clock signal by variably delaying the reference clock signal according to the phase difference detection code;

a duty adjustment circuit configured to generate a pulse signal having a constant pulse width regardless of a frequency of the reference clock signal, based on the frequency information, generate a first predetermined number of delayed pulse signals by delaying the pulse signal, as a first code in response to the pulse signal, and generate the duty correction clock signal by adjusting a slope of rising transition and a slope of falling transition of the delay clock signal according to the first code and a second code;

a latency controller configured to generate a latency signal that is activated while data is output to the outside based on the read latency and the burst length using the duty correction clock signal in response to the read command;

a row decoder configured to generate a plurality of word line selection signals by decoding the row address;

a column decoder configured to generate a plurality of column selection signals by decoding the column address;

a memory cell array comprising a plurality of memory cells and configured to output read data from one or more memory cells selected from among the plurality of memory cells according to the plurality of word line selection signals and the plurality of column selection signals in response to the read command;

a data read path unit configured to receive the read data and to generate output data using an internal clock signal;

a data output buffer configured to receive the output data and generate the data by buffering the output data;

an internal clock signal generator configured to generate a data strobe clock signal and the internal clock signal using the duty correction clock signal in response to the latency signal; and a data strobe signal output buffer configured to buffer the data strobe clock signal and output a data strobe signal to the outside, wherein the predetermined time comprises a sum of a first delay time of the clock signal input buffer, a second delay time of the internal clock signal generator, and a third delay time of the data strobe signal output buffer or the data output buffer.

16. The semiconductor memory device of claim 15, wherein the duty adjustment circuit comprises:

a pulse generator configured to generate the pulse signal at the constant pulse width regardless of the frequency of the reference clock signal based on the frequency information;

a code generator configured to generate the first predetermined number of delay pulse signals by delaying the pulse signal and generate the first predetermined number of delay pulse signals as the first code including a first predetermined number of bits in response to the pulse signal; and a duty adjuster configured to receive the delay clock signal and generate the duty correction clock signal by adjusting the slope of the delay clock signal based on the first code and the second code including a second predetermined number of bits.

17. The semiconductor memory device of claim 16, wherein the delay locked loop comprises:

a divider configured to divide the input clock signal and generate a divided input clock signal as the reference clock signal;

a delay unit configured to generate the delay clock signal by delaying the reference clock signal according to the phase difference detection code;

a delay controller configured to detect the phase difference between the reference clock signal and the feedback clock signal and to generate the phase difference detection code corresponding to the phase difference; and a clock signal delay replica unit configured to generate the feedback clock signal by delaying the duty correction clock signal by the predetermined time.

18. The semiconductor memory device of claim 17, wherein the pulse generator comprises:

a first logic circuit unit configured to receive the reference clock signal, generate an inverted reference clock signal by inverting the reference clock signal, and generate a 2-divided reference clock signal, a 4-divided reference clock signal, an inverted 4-divided reference clock signal, and an inverted 8-divided reference clock signal by dividing the reference clock signal; and a second logic circuit unit configured to generate a first signal using the inverted 8-divided reference clock signal, the 4-divided reference clock signal, and the 2-divided reference clock signal, generate a second signal using the 2-divided reference clock signal, the inverted 4-divided reference clock signal, and the inverted reference clock signal, and generate the pulse signal by selecting one of the first signal and the second signal based on the frequency information.

19. The semiconductor memory device of claim 17, wherein the code generator comprises:

one or more delay units that are connected in series and are configured to generate the first predetermined number of delayed pulse signals by delaying the pulse signal; and one or more flip-flops that are connected in parallel and are configured to receive the first predetermined number of delayed pulse signals and generate the first code in response to the pulse signal.

20. The semiconductor memory device of claim 17, wherein the duty adjuster comprises:

a first inverter configured to invert the delay clock signal to generate an inverted duty correction clock signal to a first node;

a second inverter configured to invert the inverted duty correction clock signal to generate the duty correction clock signal to a second node;

a first adjuster enabled in response to the delay clock signal and configured to adjust a first slope of rising transition and a first slope of falling transition of the inverted duty correction clock signal in response to the second code;

a second adjuster enabled in response to the inverted duty correction clock signal and configured to adjust a second slope of rising transition and a second slope of falling transition of the duty correction clock signal in response to an inverted second code, the inverted second code including the second predetermined number of bits that are inverted;

a third adjuster enabled in response to the delay clock signal and configured to adjust the first slope of rising transition and the first slope of falling transition of the inverted duty correction clock signal in response to the first code and an inverted first code, the inverted first code including the first predetermined number of bits that are inverted; and a fourth adjuster enabled in response to the inverted duty correction clock signal and configured to adjust the second slope of rising transition and the second slope of falling transition of the duty correction clock signal in response to the first code and the inverted first code.

* * * * *